US012782478B2

(12) United States Patent
Huang et al.

(10) Patent No.: US 12,782,478 B2
(45) Date of Patent: Nov. 3, 2026

(54) TRANSMISSION CABLE ASSEMBLY AND INTERFERENCE SIGNAL SUPPRESSION METHOD FOR TRANSMISSION CABLE ASSEMBLY

(71) Applicant: SHANGHAI UNITED IMAGING HEALTHCARE CO., LTD., Shanghai (CN)

(72) Inventors: Baifan Huang, Shanghai (CN); Xianwen Fan, Shanghai (CN); Junyu Chen, Shanghai (CN); Bing Wu, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 165 days.

(21) Appl. No.: 18/826,175

(22) Filed: Sep. 6, 2024

(65) Prior Publication Data

US 2025/0138116 A1 May 1, 2025

(30) Foreign Application Priority Data

Oct. 26, 2023 (CN) ......................... 202311404553.9
Jan. 19, 2024 (CN) ......................... 202420136619.4

(51) Int. Cl.
*G01R 33/36* (2006.01)

(52) U.S. Cl.
CPC ..... *G01R 33/3685* (2013.01); *G01R 33/3642* (2013.01)

(58) Field of Classification Search
CPC ......................... G01R 33/3685; G01R 33/3642
See application file for complete search history.

(56) References Cited

U.S. PATENT DOCUMENTS

| | | | | |
|---|---|---|---|---|
| 2017/0343627 | A1* | 11/2017 | Taracila ............. | G01R 33/3685 |
| 2017/0343628 | A1* | 11/2017 | Taracila ............... | G01R 33/307 |
| 2020/0233048 | A1* | 7/2020 | Corea ................ | G01R 33/3685 |
| 2021/0132164 | A1 | 5/2021 | Fuqua et al. | |
| 2022/0155389 | A1 | 5/2022 | Feng et al. | |
| 2026/0009874 | A1* | 1/2026 | Huang ............... | G01R 33/3685 |

FOREIGN PATENT DOCUMENTS

| | | | |
|---|---|---|---|
| CN | 202471940 | U | 10/2012 |
| CN | 109937367 | A | 6/2019 |
| CN | 113325348 | A | 8/2021 |
| EP | 2047732 | A2 | 4/2009 |
| EP | 2633334 | A1 | 9/2013 |
| EP | 4053578 | A1 | 9/2022 |

* cited by examiner

*Primary Examiner* — G.M. A Hyder
(74) *Attorney, Agent, or Firm* — BAYES PLLC

(57) ABSTRACT

Transmission cable assemblies and methods for suppressing common-mode currents on a transmission cable are provided. The transmission cable assembly may include a transmission cable and at least one trap fitted on the transmission cable. Each trap may include a first coil and a second coil in opposite helical directions and assembled to allow the transmission cable to insert through. The first coil and the second coil form a resonant circuit for reducing common-mode currents on the transmission cable. When there are multiple traps fitted on the transmission cable, they are spaced apart along the longitudinal axis of the transmission cable and an insulating component is placed between every two adjacent traps. The designs can make the trap filters smaller and lighter in weight while effectively reducing the impact on the local radiofrequency (B1) field.

20 Claims, 15 Drawing Sheets

TRANSMISSION CABLE ASSEMBLY AND INTERFERENCE SIGNAL SUPPRESSION METHOD FOR TRANSMISSION CABLE ASSEMBLY

CROSS-REFERENCE TO RELATED APPLICATIONS

This application claims the benefit of priority to Chinese Application No. 202311404553.9, filed Oct. 26, 2023 and Chinese Application No. 202420136619.4, filed Jan. 19, 2024, each of which is incorporated by reference into this application in its entirety.

TECHNICAL FIELD

This invention relates to the field of medical equipment technology, particularly regarding transmission cable assemblies and methods for suppressing interference signals in the transmission cable assembly.

BACKGROUND

Medical professionals can use Magnetic Resonance Imaging (MRI) systems to non-invasively obtain images of arbitrary cross-sections of the human body to assist their diagnosis. During an MRI scan, the volume transmit coil (VTC) emits power, causing significant common-mode currents in the transmission cables. The common-mode currents may cause interference to the local radiofrequency field (known as the B1 field), thus compromising image quality. To suppress or reduce these common-mode currents, traps can be installed on the cables. However, as imaging technology continues to advance, the number of elements in the MRI receiving coils increases, resulting in thicker transmission cables. The increased size of the transmission cable poses greater challenges for the design of RF traps.

One category of conventional traps, known as cable traps, are constructed by winding the transmission cable into a spiral shape, and then enclosing it with a shielding cover. One end of the shielding cover is directly soldered to the transmission cable, while the other end is connected to the transmission cable via a tuning capacitor. Because cable traps typically have a large inductance, they can effectively suppress common-mode currents while generating minimal heat. However, a cable trap has several drawbacks, such as its volume is typically large and weight is heavy, and it increases the internal RF line losses and impacts the total phase distance. Additionally, as the transmission cable becomes thicker, the diameter of the spiral windings also increases, leading to even larger and heavier traps. The drawbacks of the cable trap thus compound and become unacceptable.

Another category of conventional traps, known as floating traps, do not need to be connected to the transmission cable. They can be fitted onto and removed from the transmission cable. However, the floating trap typically has a small inductance and generates a significant amount of heat. Its performance to reduce common-mode currents relies on the size of its diameter—the larger the diameter, the better the performance. Therefore, in order to effectively suppress common-mode currents, the floating trap has to be large and thus inevitably heavy.

Embodiments of the disclosure address the above drawbacks of existing traps and provide transmission cable assemblies with improved traps that are smaller and lighter while maintaining a good performance in suppressing common-mode currents.

SUMMARY

Embodiments of the disclosure provide a transmission cable assembly. The transmission cable assembly includes a transmission cable and at least one trap detachably fitted onto the transmission cable. One of the at least one trap includes a first coil and a second coil in opposite helical directions and assembled to allow the transmission cable to insert through. The first coil and the second coil circumferentially surround at least a portion of the transmission cable. The first coil and the second coil form a resonant circuit.

In some embodiments, the first coil and the second coil are each connected to at least one tuning capacitor or the ends of the first coil and the second coil are disconnected. In some embodiments, the first coil and the second coil each form a spiral coil loop including a plurality of spiral turns wound in opposite helical directions, and the spiral turns of the first coil interleave with the spiral turns of the second coil when the first coil and the second coil are assembled. In some alternative embodiments, the first coil is formed by a first printed circuit board and a second printed circuit board located on one side of the first printed circuit board, and the second coil is formed by the first printed circuit board and a third printed circuit board located on the other side of the first printed circuit board. The first printed circuit board, the second printed circuit board, and the third printed circuit board each have a through hole to allow the transmission cable to insert through.

In some embodiments, a plurality of turns of the first coil and a plurality of turns of the second coil are distributed along a circumferential direction of the at least a portion of the transmission cable. Each turn of the first coil and each turn of the second coil are wound in the opposite helical directions.

In some embodiments, the trap further includes a bracket with a through hole, and the transmission cable is inserted into the through hole. The first coil and the second coil are wound around the outer surface of the bracket and extend along the circumferential axis of the bracket. In some further embodiments, the outer surface of the bracket has a first limiting groove and a second limiting groove. The first coil is positioned inside the first limiting groove and the second coil is inside the second limiting groove.

In some embodiments, the first printed circuit board comprises multiple first wires and multiple second wires. The second printed circuit board comprises multiple third wires, each of which is electrically connected end-to-end with one of the first wires to form the first coil. The third printed circuit board comprises multiple fourth wires, each of which is electrically connected end-to-end with one of the second wires to form the second coil. In some embodiments, at least one of the first wires, the second wires, the third wires, or the fourth wires is printed on surfaces of the first printed circuit board, the second printed circuit board, or the third printed circuit board, respectively. In some embodiments, at least one of the first wires, the second wires, the third wires, or the fourth wires is disposed inside wire grooves of the first printed circuit board, the second printed circuit board, or the third printed circuit board, respectively.

In some embodiments, the first printed circuit board comprises a first side and a second side. The first side have multiple first wire grooves and the second side have multiple second wire grooves. The first wire grooves and the second wire grooves are distributed circumferentially along the through hole. Each first wire groove has two ends each connected to a first through hole extending through to the second side. Each second wire groove has two ends each connected to a second through hole extending through to the first side. The first wires are located within the first wire grooves, with their two ends passing through the first through holes. The second wires are located within the second wire grooves, with their two ends passing through the second through holes.

In some embodiments, the adjacent first wires or the adjacent first wire grooves intersect in extension directions. The adjacent second wires or the adjacent second wire grooves intersect in extension directions.

In some embodiments, one side of the second printed circuit board comprises multiple third wire grooves distributed circumferentially along the through hole. Each third wire groove has two ends each connected to third through hole extending through to the other side of the second printed circuit board. The third wires are located within the third wire grooves, with their two ends extending through the third through holes and electrically connected to two ends of the first wires.

In some embodiments, the adjacent third wires or the adjacent third wire grooves intersect in extension directions. The adjacent first wires and the adjacent third wires have opposite tilting directions or the first wire grooves and third wire grooves have opposite tilting directions.

In some embodiments, one side of the third printed circuit board comprises multiple fourth wire grooves distributed circumferentially along the through hole. Each forth wire groove has two ends each connected to fourth through hole extending through to the other side of the third printed circuit board. The fourth wires are located within the fourth wire grooves, with their two ends extending through the fourth through holes and electrically connected to two ends of the second wires.

In some embodiments, the adjacent fourth wires or the adjacent fourth wire grooves intersect in extension directions. The second wires and the fourth wires have opposite tilting directions or the second wire grooves and fourth wire grooves have opposite tilting directions.

Embodiments of the disclosure further provide another transmission cable assembly. The transmission cable assembly includes a transmission cable and a plurality of traps detachably fitted onto the transmission cable. The traps are spaced apart along a longitudinal axis of the transmission cable. Each trap includes a first coil and a second coil in opposite helical directions and assembled to allow the transmission cable to insert through. The transmission cable assembly also includes an insulating component placed between every two adjacent traps.

In some embodiments, the first and the second coils of the plurality of traps form a plurality of resonant circuits connected in series. In some embodiments, the first coil and the second coil are each connected to at least one tuning capacitor or the ends of the first coil and the second coil are disconnected. In some embodiments, the first coil and the second coil each form a spiral coil loop including a plurality of spiral turns wound in opposite helical directions, and the spiral turns of the first coil interleave with the spiral turns of the second coil when the first coil and the second coil are assembled. In some alternative embodiments, the first coil is formed by a first printed circuit board and a second printed circuit board located on one side of the first printed circuit board, and the second coil is formed by the first printed circuit board and a third printed circuit board located on the other side of the first printed circuit board. The first printed circuit board, the second printed circuit board, and the third printed circuit board each have a through hole to allow the transmission cable to insert through.

Embodiments of the disclosure further provide a method for reducing an interference signal on a transmission cable. The method includes fitting a trap onto the transmission cable. The trap includes a first coil and a second coil in opposite helical directions. The method further includes adjusting at least one parameter of the trap to form a resonance circuit between the first coil and the second coil.

In some embodiments, adjusting at least one parameter of the trap includes adjusting at least one tuning capacitor connected to the first coil or the second coil. In some alternative embodiments, adjusting at least one parameter of the trap includes adjusting a number of spiral turns in the first coil or the second coil or adjusting a relative position between the first coil and the second coil to change a distributed capacitance between the first coil and the second coil.

Embodiments of the disclosure provide a radio frequency (RF) coil assembly for a magnetic resonance imaging (MRI) system. The RF coil assembly comprises a RF coil, a transmission cable, and at least one trap. The transmission cable is coupled to the RF coil. The at least one trap detachably fitted onto the transmission cable. One of the at least one trap comprises two parallel wires. The two parallel wires are wound in a spiral and circumferentially wrap around at least a portion the transmission cable; or the trap comprises two counter-wound wires, and the two counter-wound wires are wound in a spiral and circumferentially wrap around at least a portion the transmission cable.

In some embodiments, the trap further comprises a bracket with a through hole. The transmission cable is inserted into the through hole, the two parallel wires or the two counter-wound wires are wound around the outer surface of the bracket and extend along a circumferential axis of the bracket.

It is to be understood that both the foregoing general description and the following detailed description are exemplary and explanatory only and are not restrictive of the invention, as claimed.

DETAILED DESCRIPTION

Figure 1:
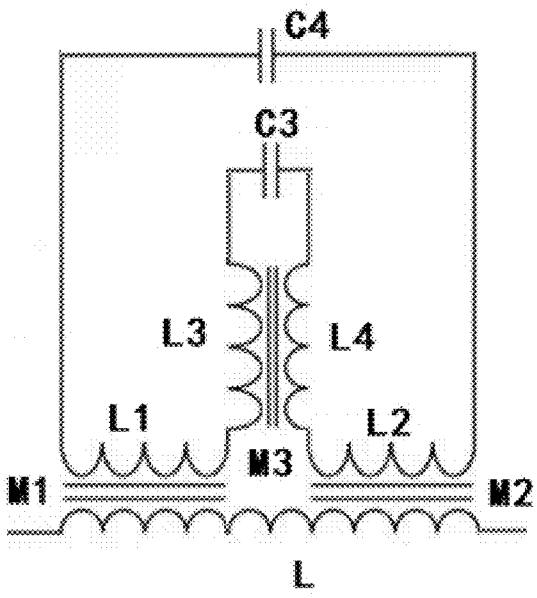
FIG. 1 shows an equivalent circuit diagram of an exemplary transmission cable assembly according to embodiments of the present disclosure.

Reference will now be made in detail to the exemplary embodiments, examples of which are illustrated in the accompanying drawings.

Throughout the descriptions, it is contemplated that terms that indicate orientation or positional relationships, such as "center," "longitudinal," "lateral," "length," "width," "thickness," "up," "down," "front," "back," "left," "right," "vertical," "horizontal," "top," "bottom," "inner," "outer," "clockwise," "counterclockwise," "anticlockwise," "axial," "radial," "circumferential," are not limited to the particular orientations or positional relationships shown in the drawings. They are used only for describing the embodiments but should not be construed as the devices or components referred to must have a specific orientation, be constructed and operated in a specific orientation, or in any other ways limiting the scope of the claims.

Furthermore, the ordinal terms such as "first," "second," "third" and so on are used only for identifying different features in the exemplary embodiment. They should not be understood as indicating or implying relative importance of those features. The order of features described carries no significance unless expressly described in this disclosure. In addition, the use of ordinal terms does not suggest the feature is limited to one. That is, a feature referred to using "first," "second," can include one or more such features. Throughout the description of this invention, "multiple" means at least two, such as two, three, etc., unless otherwise specified.

In addition, unless otherwise explicitly specified and limited, terms such as "installation," "connect," "fit," "attach," or "fix," and so on should be understood in a broad sense. For example, they could mean permanently connected or detachably connected, or integrated; they could be mechanical connections or electrical connections; they could be directly connected, or indirectly connected through an intermediary medium, and can represent the communication inside two components or the interaction between two components, unless otherwise described in the disclosure.

Throughout the disclosure, unless otherwise explicitly specified and limited, a first feature "on" or "under" a second feature may include embodiments that the first and second features are in direct contact, or that the first and second features are indirectly in contact through an intermediary medium. In addition, a first feature "above," "over," and "on top of" a second feature may include that the first feature is directly above or obliquely above the second feature, or simply that the first feature's elevation is higher than that of the second feature. Similarly, a first feature "below," "beneath," and "underneath" a second feature can mean that the first feature is directly below or obliquely below the second feature, or simply that the first feature's elevation is lower than that of the second feature.

The present disclosure may provide at least one trap used to suppress interference signals on a transmission cable. Each of the at least one trap may include at least two coils fitted on (e.g., detachably fitted on) the transmission cable. The at least two coils may form a resonant circuit, thereby reducing common-mode current on the transmission cable.

When the at least two coils include a first coil and a second coil and the at least one trap includes a single trap, an equivalent circuit diagram is shown in FIG. 1. L denotes an equivalent inductor of the transmission cable, L1 denotes an equivalent inductor of the first coil, L2 denotes an equivalent inductor of the second coil, L3 and L4 denotes inductors formed by coupling between the first coil and the second coil, C3 and C4 denotes distributed capacitors between the first coil and the second coil, M1 denotes a mutual inductance between the first coil and the transmission cable, M2 denotes a mutual inductance between the second coil and the transmission cable, and M3 denotes a mutual inductance between the first coil and the second coil. In some embodiments, the inductors L1, L2, L3, and L4 and the distributed capacitors C3 and C4 form the resonant circuit.

In some embodiments, adjusting the number of spiral turns or change the relative positions of the first coil and the second coil influences the equivalent circuit's inductance values (L1, L2, L3, and L4) and/or the distributed capacitances (C3 and C4). Adjusting the number of turns or the positions allows for resonance and the suppression of common-mode currents.

In some current scenarios, the trap only includes a single coil, in order to reduce the common-mode currents on the transmission cable, the current of the single coil is large, causing the overheat of the single coil. By setting multiple coils included in the trap according to the present disclosure, currents can be distributed/dispersed in the multiple coils, reducing the heat generated in each individual coil of the multiple coils.

Besides, fitting the disclosed trap to the transmission cable without direct electrical connections improves maintainability. The disclosed trap skips the need to wind the transmission cable itself. Accordingly, the volume of the trap is no longer limited by the thickness of the transmission cable, allowing them to be smaller and lighter. The design can reduce the size and weight of the trap, while achieving the desired common-current reduction effects.

In some embodiments, a count of the at least one trap may be multiple, that is, multiple traps are (evenly) provided on the transmission cable along a longitudinal axis of the transmission cable. An insulating component may be placed between two adjacent traps, preventing short circuits between the traps. In some embodiments, the insulating component may be made of an insulating material, such as air, plastic, rubber, glass, ceramics, epoxy resin, etc. The insulation properties between the adjacent two traps may be different due to different insulating dielectric of different insulating materials.

The serial arrangement may provide enhanced common-mode current suppression capabilities and results in low heat generation, and thus are suitable for different types of transmission cables. The serial traps can be easily installed on and completely detached from any transmission cable without affecting any coil parameters, making it convenient for manufacturing and debugging. This also disperses the energy across multiple traps, reducing the heat generated by individual traps. Even if a specific trap is damaged, it will not affect the overall effectiveness of common-mode current suppression. In some embodiments, the multiple traps may be evenly distributed along the transmission cable, further enhancing the effectiveness of suppressing common-mode currents in the transmission cable.

In some embodiments, the resonance and/or the suppression of common-mode currents may be adjusted by adjusting one or more parameters of the at least two coils, setting one or more gaps, setting one or more additional components, or the like, or any combination thereof. The parameter (s) include a winding direction of the at least two coils, a length of a coil, a diameter of the coil, number of turns of the coil, a space between the at least two coils, etc. The one or more additional component(s) include a tuning capacitor, a twisted pair structure, etc. In some embodiments, the tuning capacitor includes an additional capacitor disposed on the coil, e.g., a lumped capacitor.

Figure 2:
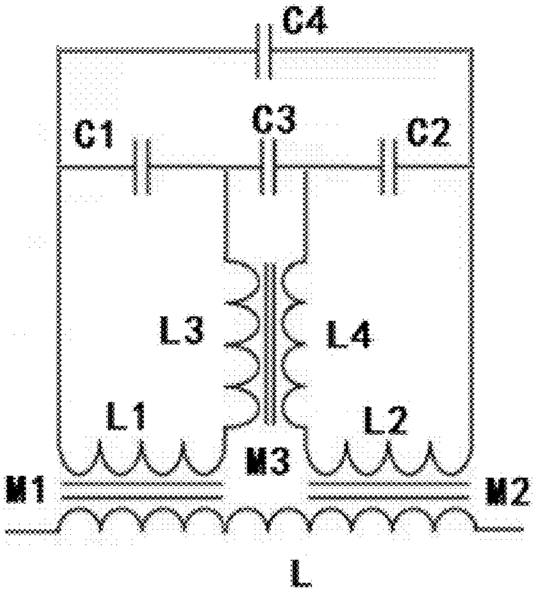
FIG. 2 shows an equivalent circuit diagram of an exemplary transmission cable assembly according to embodiments of the present disclosure.

When the at least two coils include a first coil and a second coil, the at least one trap includes a single trap, and the first coil and the second coil each includes an additional tuning capacitor, an equivalent circuit diagram is shown in FIG. 2. L denotes an equivalent inductor of the transmission cable, L1 denotes an equivalent inductor of the first coil, L2 denotes an equivalent inductor of the second coil, L3 and L4 denotes inductors formed by coupling between the first coil and the second coil, C3 and C4 denotes distributed capacitors between the first coil and the second coil, M1 denotes an mutual inductance between the first coil and the transmission cable, M2 denotes an mutual inductance between the second coil and the transmission cable, M3 denotes an mutual inductance between the first coil and the second coil, C1 denotes a tuning capacitor of the first coil, C2 denotes a tuning capacitor of the second coil. In some embodiments, the inductors L1, L2, L3, and L4 and the capacitors C1, C2, C3, and C4 form a resonant circuit (e.g., a parallel resonant circuit).

In some embodiments, adjusting the capacitance values of C1 and C2 allows for resonance. Accordingly, the first coil and the second coil collectively form an equivalent circuit that can function as a resonant circuit to suppress common-mode currents in the transmission cable. As a result, the trap can effectively eliminate or reduce the impact of the common-mode currents on the local RF (B1) field. The external signal interference with the RF coil reception signals during transmission is thereby reduced.

Figure 3:
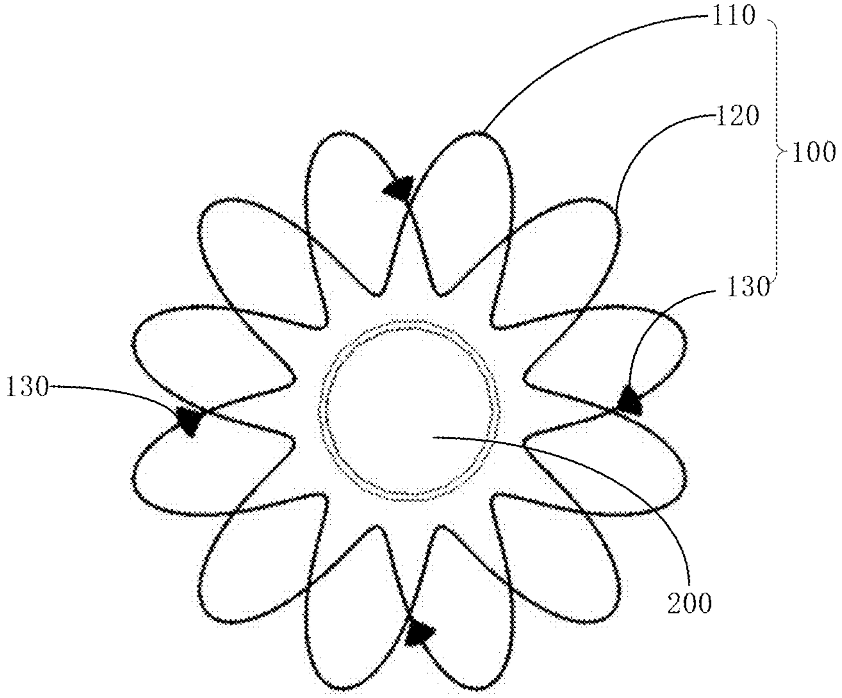
FIG. 3 is a schematic diagram showing a front view of a transmission cable assembly with a closed-loop spiral coil trap and a transmission cable inserted therein, according to embodiments of the present disclosure.
Figure 5:
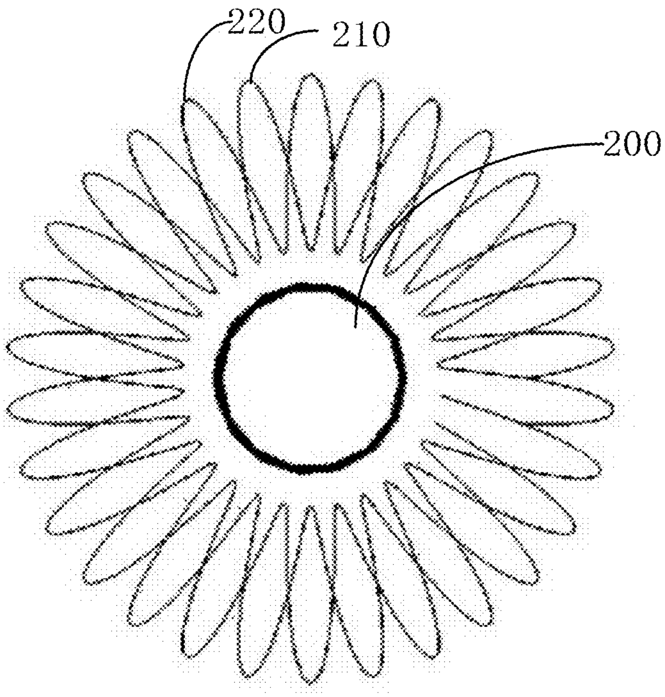
FIG. 5 is a schematic diagram showing a front view of a transmission cable assembly with an open-loop spiral coil trap and a transmission cable inserted therein, according to embodiments of the present disclosure.

Since the capacitance value of the capacitor formed by the gap is usually smaller than the capacitance value of the lumped capacitor, the size of the trap with the lumped capacitor can be smaller than the size of the trap with the gap (e.g., as shown in FIGS. 3 and 5), by achieving the same effect.

In some embodiments, the at least two coils may be wound in different winding directions (design 1) or in the same winding direction (design 2). Since the amount of magnetic field generated in design 1 is larger than the amount of magnetic field generated in design 2, by achieving the same effect, the size of the trap including the at least two coils in different winding directions may be much smaller than the size of the trap including the at least two coils in the same winding direction.

In some embodiments, the at least two coils may circumferentially surround at least a portion of the transmission cable. In some embodiments, the transmission cable includes multiple portions along the longitude direction of the transmission cable. For example, the at least a portion of the transmission cable may include one portion of the multiple portions of the transmission cable. In some embodiments, a trap is fitted onto each of at least one portion of the multiple portions of the transmission cable.

Figure 4:
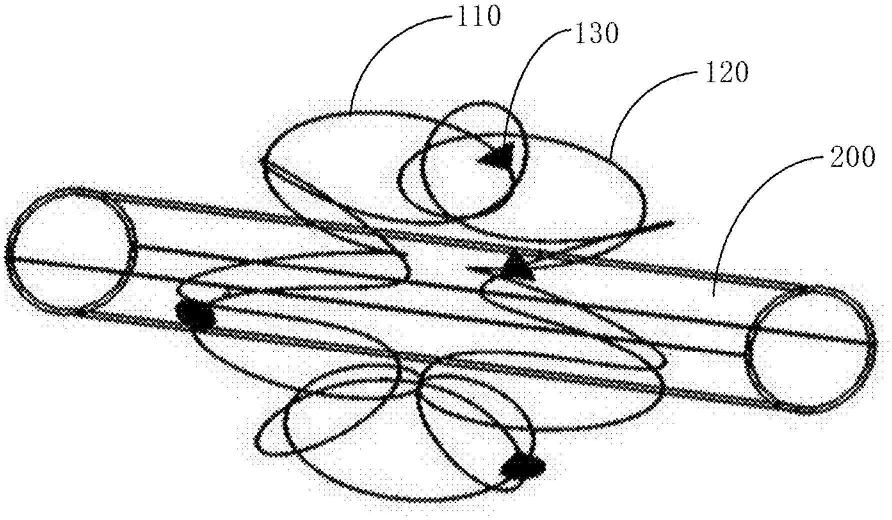
FIG. 4 is a schematic diagram showing an isometric view of a transmission cable assembly with a closed-loop spiral coil trap and a transmission cable inserted therein, according to embodiments of the present disclosure.

The winding direction of one (e.g., each) of the at least two coils is a clockwise direction or the winding direction of the coil is an anticlockwise direction. When the coil is wound in the clockwise direction, it means that each turn of the coil is wound in the clockwise direction, and multiple turns of the coil is (spirally) distributed along a circumferential direction of the at least a portion of the transmission cable (e.g., as shown in FIG. 4). When the coil is wound in the anticlockwise direction, it means that each turn of the coil is wound in the anticlockwise direction, and multiple turns of the coil is (spirally) distributed along a circumferential direction of the at least a portion of the transmission cable (e.g., as shown in FIG. 4). "Clockwise direction" used herein means that: if the coil starts at the top of the transmission cable (the 12 o'clock position on a clock), it moves to the right (towards the 3 o'clock position), then down (towards the 6 o'clock position), then to the left (towards the 9 o'clock position), and finally back up towards the starting point at the top (12 o'clock position). "Anticlockwise direction" used herein means that: if the coil starts at the top of the transmission cable (the 12 o'clock position on a clock), it moves to the left (towards the 9 o'clock position), then down (towards the 6 o'clock position), then to the right (towards the 3 o'clock position), and finally back up towards the starting point at the top (12 o'clock position).

In some embodiments, the at least two coils may be wound into a shape such that the coils effectively form inductances. For example, the shape may include a spiral shape (e.g., a rosette spiral shape) with multiple spiral turns, an elliptic shape with multiple elliptic turns, a square shape with multiple square turns, etc.

In some embodiments, the at least two coils may be made of a conductive material.

In some embodiments, the at least two coils may be assembled to allow the transmission cable to insert through. For example, the transmission cable may be inserted into a center through hole of the trap and the trap may then be detachably fixed to transmission cable.

In some embodiments, the transmission cable can be either a direct current transmission cable or an alternating current transmission cable. In some embodiments, the transmission cable may be an RF (radiofrequency) transmission cable used for transmitting RF coil reception signals during MRI scans. It is contemplated that transmission cable can be used in other signal transmission applications, beyond transmitting RF signals in the MRI setting. The transmission cable assemblies and traps described in this application can be used with any transmission cable without limitation of ultimate use of that transmission cable.

In some embodiments, the at least two coils may be directly wound around the transmission cable, that is, no other component is between the at least two coils and the transmission cable.

In some embodiments, at least one bracket may be arranged to support the at least two coils. The at least two coils may be wound around the at least one bracket. In some embodiments, the outer peripheral surface of the at least one bracket may include at least two limiting grooves, which extend spirally along the circumferential axis of at least one bracket. The at least two limiting grooves may allow the at least two coils to be positioned inside the at least two limiting grooves, respectively. By having these limiting grooves, the at least two coils may be guided and supported by the at least one bracket, ensuring stability and facilitating the winding process. In some embodiments, the limiting grooves are unnecessary, the at least two coils are directly wound around the at least one bracket.

In some embodiments, a shape of a cross-section of the bracket is non-limiting only if the at least one bracket is able to support the at least two coils. For example, the cross-section of the bracket has a circular ring shape, an elliptic shape, a quadrangular shape, a trapezoid shape, or other regular/irregular shapes. In some embodiments, the at least one bracket is made of an insulating material.

Figure 8:
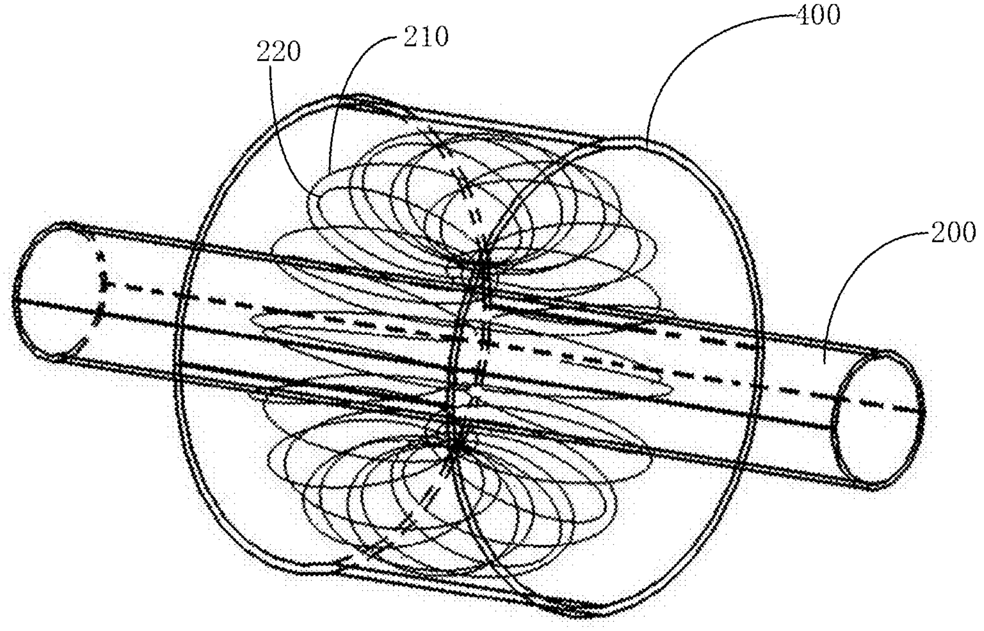
FIG. 8 is a schematic diagram showing an isometric view of a transmission cable assembly with an open-loop spiral coil trap fitted to a transmission cable and a shielding enclosure around the spiral coil trap, according to embodiments of the present disclosure.
Figure 31:
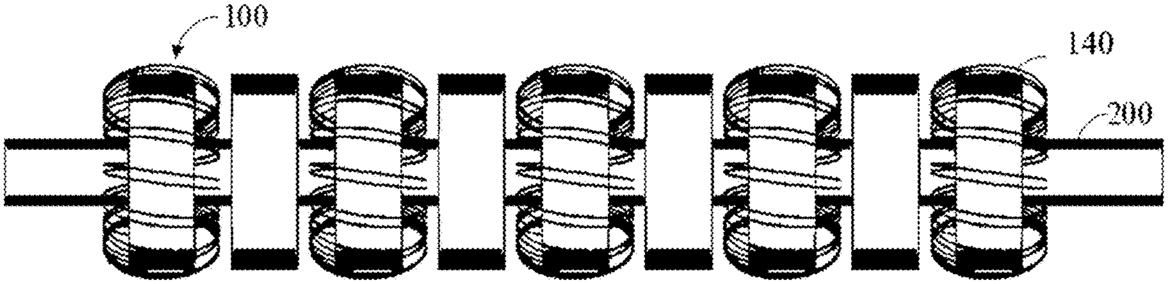
FIG. 31 is a schematic diagram showing multiple traps fitted on a transmission cable with a bracket according to embodiments of the present disclosure.

In some embodiments, to further reduce the impact of the magnetic field leaking from the coils (e.g., on the RF field), a shielding enclosure may be placed outside the at least one trap (e.g., as shown in FIG. 8, FIG. 31). The shielding enclosure may have a shielding effect, shielding the magnetic field generated by the at least one trap. In some embodiments, the shielding enclosure may cover the at least one trap. In some embodiments, a shape of a cross-section of the shielding enclosure is non-limiting only if the shielding enclosure is able to cover the at least one trap. For example, the cross-section of the shielding enclosure may have a circular ring shape, an elliptic shape, a quadrangular shape, a trapezoid shape, or other regular/irregular shapes. In some embodiments, the shielding enclosure may be made of copper, aluminum, silver, etc. An insulating medium may be filled between the shielding enclosure and the at least one trap for insulation and fixation.

In the case of the existence of multiple traps, each trap may be covered with a shielding enclosure or at least two traps may be covered with a same shielding enclosure. For example, a long shielding enclosure may be used to cover all of the multiple traps 100 simultaneously.

In some embodiments, the at least two coils in the trap can be implemented in various different ways. In some embodiments, the at least two coils can be implemented using printed circuit boards (PCBs).

In some embodiments, a gap of a coil may be formed when two ends of the coil are disconnected. When a coil has at least one gap, the coil may be denoted as an open-loop coil; when the coil has no gap, the coil may be denoted as a closed-loop coil. In some embodiments, the trap(s) and the transmission cable may be collectively denoted as a transmission cable assembly.

In some embodiments, a count of the at least one two coils may be non-limiting, for example, 2, 3, 4, or more than 4. For illustration purpose, below the at least two coils including two coils (e.g., a first coil and a second coil) will be illustrated in detail as an example.

Some embodiments of the present disclosure may describe at least one trap used to suppress interference signals on a transmission cable. The at least one trap may be fitted on (e.g., detachably fitted on) the transmission cable. Each trap may include a first coil and a second coil in different winding directions and assembled to allow the transmission cable to insert through. The first coil and the second coil may form a resonant circuit for reducing common-mode currents on the transmission cable. When there are multiple traps fitted on the transmission cable, they are spaced apart along the longitudinal axis of the transmission cable and an insulating component may be placed between every two adjacent traps. For example, the insulating component may be made of insulating material, such as plastic, resin, glass, rubber, etc.

In some embodiments, the transmission cable may be RF transmission cable used for transmitting RF coil reception signals during MRI scans, and the at least one trap may be denoted as RF trap(s) used to suppress interference signals on the transmission cable, thus reducing the impact on the local radiofrequency (B1) field.

In some embodiments, the first coil and the second coil may circumferentially surround at least a portion of the transmission cable. In some embodiments, the transmission cable includes multiple portions along the longitude direction of the transmission cable. For example, the at least a portion of the transmission cable may include one portion of the multiple portions of the transmission cable. In some embodiments, a trap is fitted onto each of at least one portion of the multiple portions of the transmission cable.

The first coil and the second coil may be in different winding directions. The different winding directions may include opposite winding directions (e.g., opposite helical directions), i.e., the clockwise direction and the anticlockwise direction. When a coil is wound in the clockwise direction, it means that each turn of the coil is wound in the clockwise direction, and multiple turns of the coil is (spirally) distributed along a circumferential direction of the at least a portion of the transmission cable (e.g., as shown in FIG. 4). When a coil is wound in the anticlockwise direction, it means that each turn of the coil is wound in the anticlockwise direction, and multiple turns of the coil is (spirally) distributed along a circumferential direction of the at least a portion of the transmission cable (e.g., as shown in FIG. 4).

In some embodiments, two coils are wound in opposite winding directions, and the two coils are also referred to as two counter-wound wires.

In some embodiments, the at least two coils included in the trap are parallel wires wound in a spiral and circumferentially wrap around at least a portion of the transmission cable. For example, the trap includes two coils, and the two coils are parallel.

The effectiveness of the disclosed traps including the opposite winding directions can be explained from two perspectives.

From an electromagnetic field perspective, the first coil and the second coil are both constructed as spiral loops but with opposite helical directions. When common-mode currents are generated on the transmission cable, the first coil and the second coil generate magnetic fields in the same direction within them. These magnetic fields inside the first coil and the second coil add up, producing currents opposite to the common-mode currents along the axial direction of the cable, thus countering the common-mode currents in the transmission cable. On the other hand, due to the opposite helical directions of the two coils, the current directions on the first coil and the second coil are also opposite. As a result, the magnetic fields outside the first coil and the second coil cancel each other out, thus reducing the impact on the local RF (B1) field. Further, placing the first coil and the second coil in overlapping positions allows them to form mutual inductance, distributing the energy coupled from the transmission cable to the traps into two current paths, effectively reducing heat.

From a circuit perspective, winding the first coil and the second coil each in a spiral loop shape can form a (parallel) resonant circuit with inductors connected in parallel with tuning capacitors. Such an equivalent circuit creates a high impedance. When the trap is placed on the transmission cable, the high impedance is applied to the transmission cable via coupling, hindering the passage of common-mode currents through the transmission cable. The mutual inductance between the first coil and the second coil reduces the overall equivalent inductance, thus reducing heat generation.

FIG. 3 is a schematic diagram showing a front view of a transmission cable assembly with a closed-loop spiral coil trap 100 and a transmission cable 200 inserted therein, according to embodiments of the present disclosure. FIG. 4 is a schematic diagram showing an isometric view of a transmission cable assembly according to embodiments of the present disclosure. FIGS. 3 and 4 will be described together.

As shown in FIG. 3 and FIG. 4, transmission cable assembly consists of a transmission cable 200 and a trap 100 fitted onto transmission cable 200.

Trap 100 may be detachably fitted to transmission cable 200. In some embodiments, transmission cable 200 may be inserted into a center through hole of trap 100 and trap 100 may be then detachably fixed to transmission cable 200 through a fixing means. In one embodiment, as shown in FIGS. 3 and 4, trap 100 may include a first coil 110 and a second coil 120 in opposite winding directions, that is, first coil 110 and second coil 120 are designed as two counter-wound wires. First coil 110 and second coil 120 are wound in a spiral and wrap around transmission cable 200. In some embodiments, first coil 110 and second coil 120 may both be closed-loop spiral coils, as shown in FIGS. 3 and 4. First coil 110 and second coil 120 may be wound into shapes such that the coils effectively form inductances. As shown in FIG. 3, in some embodiments, first coil 110 and second coil 120 may both be helically wound in a rosette spiral shape with multiple spiral turns.

Consistent with the disclosure, first coil 110 and second coil 120 may have opposite helical directions. First coil 110 and second coil 120 may be assembled to collectively form trap 100, which can be fitted onto transmission cable 200. The size of first coil 110 and second coil 120 may be adjusted according to the diameter of transmission cable 200 so that the coils are snuggly fitted to transmission cable 200.

In some embodiments, first coil 110 and second coil 120 may each include at least one tuning capacitor 130. The quantity of tuning capacitors used on first coil 110 and second coil 120 can vary, such as one, two, three, or more, depending on the actual application. As shown in the example of FIGS. 3 and 4, each coil is coupled with two tuning capacitors 130.

First coil 110 and second coil 120 function as inductors that, in parallel with tuning capacitors 130, create a high impedance. When trap 100 is fitted onto transmission cable 200, this high impedance is coupled to transmission cable 200, hindering the passage of common-mode currents in transmission cable 200 when it is placed in an electromagnetic field. By adjusting the capacitance value of tuning capacitor 130, resonance is achieved between first coil 110 and second coil 120, which helps to suppress common-mode currents. In some embodiments, a lumped capacitance may be used as tuning capacitor 130, and it is connected to both first coil 110 and second coil 120.

In some embodiments, the transmission cable assembly of FIGS. 3 and 4 can be used to perform an interference signal suppression method. The method includes connecting at least one tuning capacitor 130 to either first coil 110 or second coil 120 and then adjusting capacitance of tuning capacitor 130 to form a resonant circuit with first coil 110, second coil 120, and tuning capacitor 130. This resonant circuit is used to suppress interference from external signals on the RF reception signal during transmission. In some embodiments, an equivalent circuit diagram of the transmission cable assembly of FIGS. 3 and 4 is shown and illustrated in FIG. 2 above, which is not repeated herein.

In some embodiments, the transmission cable 200 may be an RF transmission cable used for transmitting RF coil reception signals during MRI scans. The opposite helical directions of first coil 110 and second coil 120 cause them to generate magnetic fields in the same direction along the circumferential distribution within transmission cable 200 when common-mode currents are present. Since their helical directions are opposite, the currents induced on first coil 110 and second coil 120 cancel each other's magnetic fields externally, reducing their impact on the local RF (B1) field. Internally, the magnetic fields generated by first coil 110 and second coil 120 add up, creating a current along the axis of transmission cable 200 opposite to the direction of the common-mode currents, effectively suppressing or reducing the currents.

In some embodiments, to minimize the size of trap 100 and its weight, first coil 110 and second coil 120 are placed one above the other to form an assembly that creates a mutual inductance. In some embodiments, first coil 110 and second coil 120 may both be helically wound in a rosette spiral shape, and the coils are assembled such that spiral turns of first coil 110 interleave with spiral turns of second coil 120. The mutual inductance allows the energy coupled from transmission cable 200 into trap 100 to be distributed into two current paths, reducing heat dissipation from the trap to the cable and resulting in a smaller and lighter trap.

In some embodiments, first coil 110 and second coil 120 include at least one gap, that is, first coil 110 and second coil 120 may both be constructed as open-loop coils (e.g., open-loop spiral coils), and capacitators are formed in gaps. For example, FIG. 5 is a schematic diagram showing a front view of a transmission cable assembly with an open-loop spiral coil trap and a transmission cable inserted therein, according to embodiments of the present disclosure.

Figure 6:
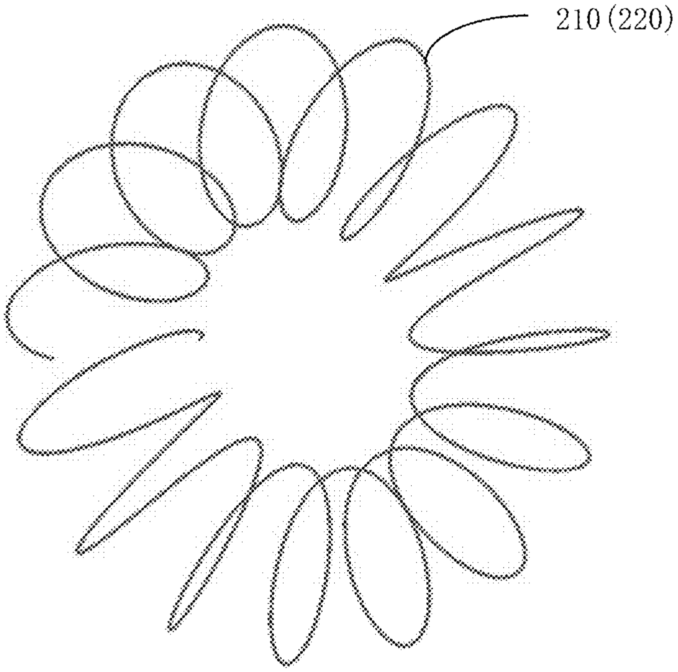
FIG. 6 is a schematic diagram showing an open-loop spiral coil, according to embodiments of the present disclosure.

In some embodiments, as shown in FIG. 5, the transmission cable assembly may consist of transmission cable 200 and a trap fitted onto transmission cable 200. The trap may include a first coil 210 and a second coil 220. First coil 210 and second coil 220 may be each helically wound into a spiral loop with ends disconnected, forming an open-loop spiral coil. For example, FIG. 6 is a schematic diagram showing an open-loop spiral coil 210 or 220, according to embodiments of the present disclosure. As shown in FIG. 6, the two ends of the spiral coil are disconnected. Similar to first coil 110 and second coil 120 in FIGS. 3 and 4, first coil 210 and second coil 220 may be wound into shapes such that the coils effectively form inductances, such as a rosette spiral shape with multiple spiral turns, as shown in FIGS. 5 and 6.

Consistent with the disclosure, first coil 210 and the second coil 220 may have opposite helical directions. First coil 210 and second coil 220 may be assembled to collectively form trap 100. When first coil 210 and second coil 220 are assembled, distributed capacitance will form between the two coils.

Figure 7:
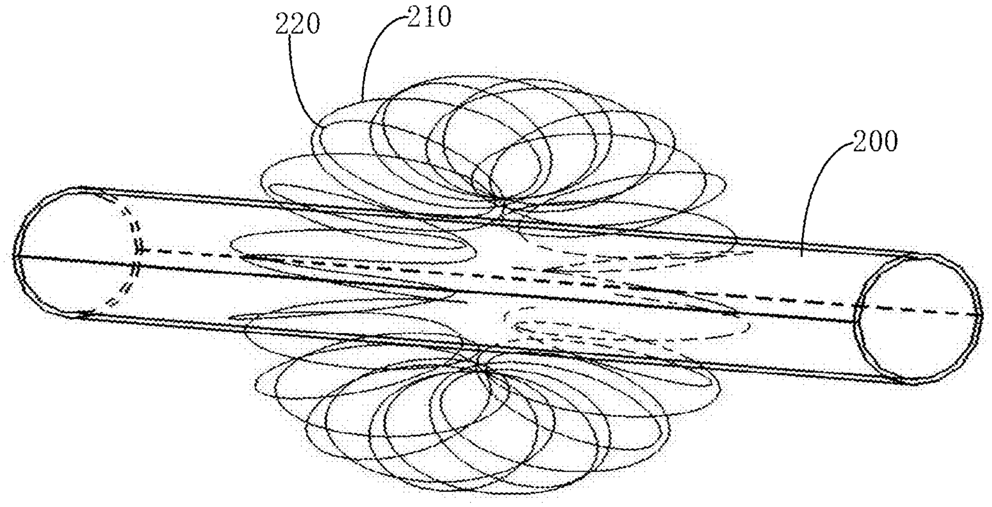
FIG. 7 is a schematic diagram showing an isometric view of a transmission cable assembly with a closed-loop spiral coil trap and a transmission cable inserted therein, according to embodiments of the present disclosure.

The size of first coil 210 and second coil 220 may be adjusted according to the diameter of transmission cable 200 so that the coils are snuggly fitted to transmission cable 200 to form the transmission cable assembly. FIG. 7 is a schematic diagram showing an isometric view of the transmission cable assembly of FIG. 5, according to embodiments of the present disclosure. In this assembly, first coil 210 and second coil 220 collectively form an equivalent circuit that can function as a resonant circuit to suppress common-mode currents in transmission cable 200.

In some embodiments, the transmission cable assembly of FIGS. 5-7 can be used to perform an interference signal suppression method. The method may include adjusting the number of spiral turns in first coil 210 or second coil 220, the length of the first coil 210 or the second coil 220, the position of the gap of first coil 210 or second coil 220, or a count of the gap of first coil 210 or second coil 220, thus creating a resonant circuit formed by the coils. This resonant circuit can be used to suppress common-mode currents induced by external signals during transmission.

In some embodiments, to further reduce the impact of the magnetic field leaking from the coils on the RF field, a shielding enclosure may be placed outside the trap. For example, FIG. 8 is a schematic diagram showing an isometric view of a transmission cable assembly with the open-loop spiral coil trap fitted to the transmission cable and a shielding enclosure 400 around the spiral coil trap, according to embodiments of the present disclosure. In some embodiments, shielding enclosure 400 may be made of copper foil. Placing shielding enclosure 400 outside the trap helps minimize the effect on the local RF (B1) field.

Figure 9:
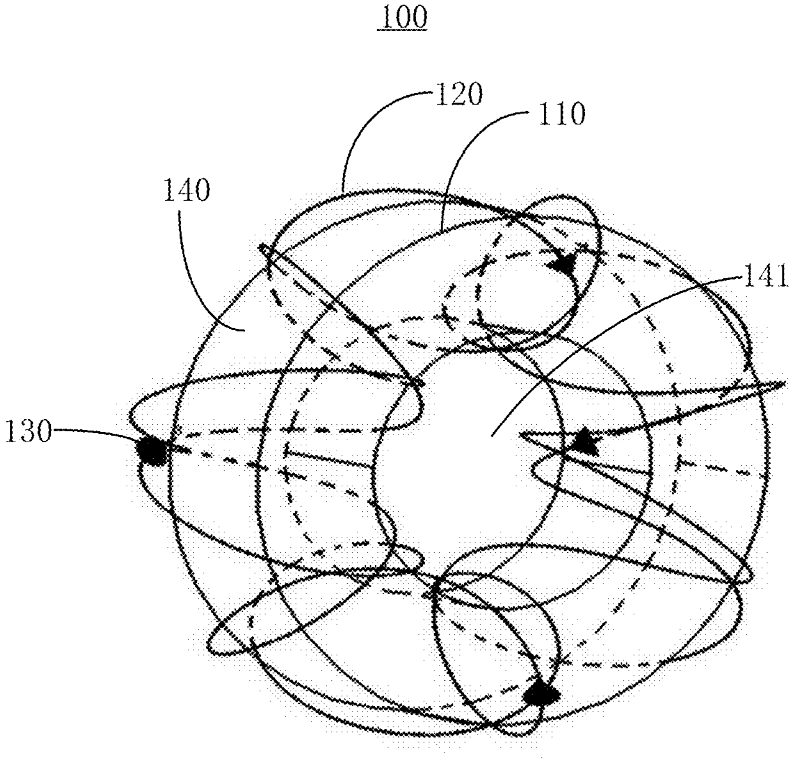
FIG. 9 is a schematic diagram showing a closed-loop spiral coil trap wound around a bracket, according to embodiments of the present disclosure.

In some embodiments, the trap may further include a bracket to support the first coil and second coil and allow the transmission cable to pass through the trap. For example, FIG. 9 is a schematic diagram showing a closed-loop spiral coil trap 100 wound around a bracket 140, according to embodiments of the present disclosure. As shown in FIG. 9, trap 100 includes bracket 140 as a support frame to first coil 110 and second coil 120. Bracket 140 includes a through hole 141 in the center to allow transmission cable 200 to be inserted and pass through. First coil 110 and second coil 120 are wound around bracket 140, ensuring their stability on transmission cable 200.

Figure 10:
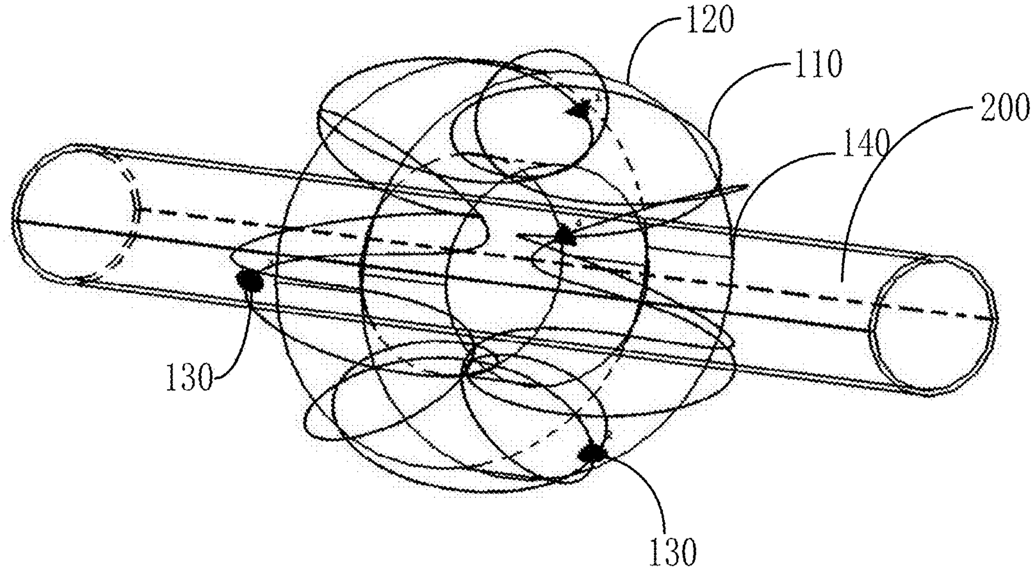
FIG. 10 is a schematic diagram showing a closed-loop spiral coil trap wound around a bracket with a transmission cable inserted in a through hole of the bracket, according to embodiments of the present disclosure.

In some embodiments, bracket 140 is designed to have a circular ring shape, and first coil 110 and second coil 120 are helically wound around the outer surface of bracket 140. First coil 110 and second coil 120 may each be wounded around bracket 140 into a closed loop. For example, FIG. 10 is a schematic diagram showing a closed-loop spiral coil trap wound around a bracket with a transmission cable inserted in a through hole of the bracket, according to embodiments of the present disclosure. Both first coil 110 and second coil 120 include tuning capacitors 130, and are wound around bracket 140 to form trap 100. In some embodiments, the two coils may be wound in a way to overlap with each other in order to form inductances for common-mode current suppression. Transmission cable 200 is inserted in through hole 141 in the center of bracket 140.

Figure 11:
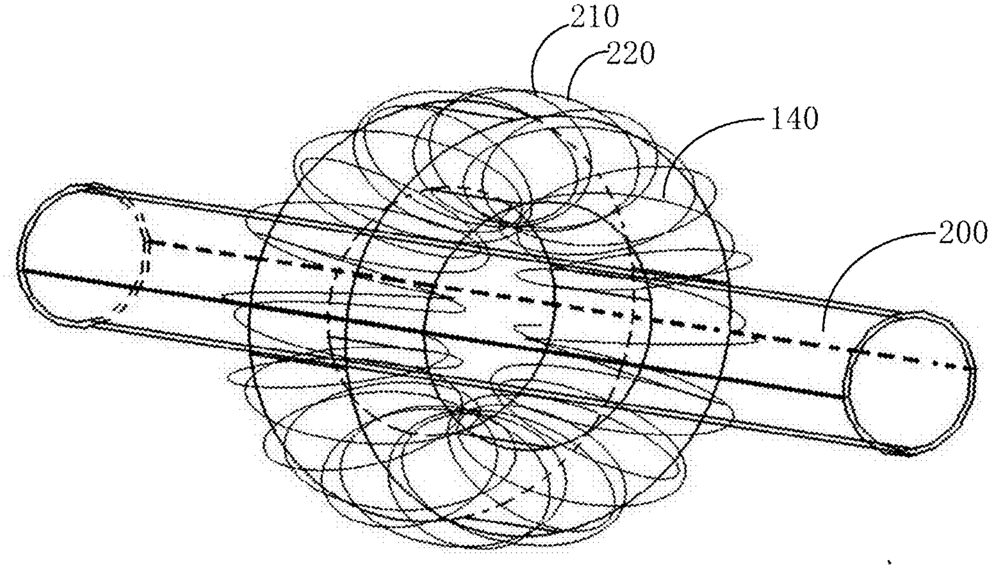
FIG. 11 is a schematic diagram showing a transmission cable assembly with an open-loop spiral coil trap wound around a bracket and a transmission cable inserted therein, according to embodiments of the present disclosure.

In some alternative embodiments, first coil and second coil may each be wounded around bracket 140 into an open loop, with disconnected ends. For example, FIG. 11 is a schematic diagram showing a transmission cable assembly with an open-loop spiral coil trap wound around a bracket and a transmission cable inserted therein, according to embodiments of the present disclosure. First coil 210 and second coil 2220 do not include any tuning capacitor, but instead, are wound around bracket 140 to form capacitances between them. Transmission cable 200 is then inserted in through hole 141 in the center of bracket 140.

In some embodiments, the outer peripheral surface of bracket 140 may include first and second limiting grooves (see FIGS. 10-17), which extend spirally along the circumferential axis of bracket 140. These grooves have opposite helical directions, allowing first coil 110 (or 210) to be positioned inside the first limiting groove and second coil 120 (or 220) inside the second limiting groove. By having these limiting grooves, the first coil and the second coil are guided and supported by bracket 140, ensuring stability and facilitating the winding process.

In some embodiments, the limiting grooves can have a square shape or a U-shape. In such shapes, the depth of the first limiting groove can be greater than the diameter of the first coil, and the depth of the second limiting groove can be greater than the diameter of the second coil. This design prevents the coils from making direct contact with transmission cable 200 when the trap is fitted onto it by inserting transmission cable 200 through bracket 140, thus preventing short circuits and ensuring the reliability of the trap.

While FIGS. 3-11 show embodiments of trap 100 that includes helically wound loop coils, the first coil and second coil in the trap can be implemented in various different ways. In some embodiments, these two coils can be implemented using printed circuit boards (PCBs). For example, the two coils may be implemented with three PCBs stacked to form a trap assembly, as will be described in connections with FIGS. 12-17. In those exemplary embodiments, the first coil may be implemented using a first PCB and a second PCB, and the second coil may be implemented using the first PCB and a third PCB. The second PCB may be located on one side of the first PCB. The third PCB may be located on the other side of the first PCB. The first PCB, the second PCB, and the third PCB may each have a through hole to allow the transmission cable to insert through.

In some embodiments, the first PCB includes multiple first wires (first conducting wires) and multiple second wires (second conducting wires). The second PCB includes multiple third wires, and each of the multiple third wires (third conducting wires) is electrically connected end-to-end with one of the first wires to form the first coil. The third PCB includes multiple fourth wires (fourth conducting wires), and each of the multiple fourth wires is electrically connected end-to-end with one of the second wires to form the second coil.

In some embodiments, at least one of the first wires, the second wires, the third wires, or the fourth wires is disposed inside wire grooves of the first printed circuit board, the second printed circuit board, or the third printed circuit board, respectively. In some embodiments, the wire grooves are unnecessary, and at least one of the first wires, the second wires, the third wires, or the fourth wires is printed on surfaces of the first printed circuit board, the second printed circuit board, or the third printed circuit board, respectively.

In some embodiments, the first PCB includes a first side and a second side. The first side has multiple first wire grooves and the second side has multiple second wire grooves. The first wire grooves and the second wire grooves are distributed circumferentially along the through hole. Each first wire groove has two ends each connected to a first through hole extending through to the second side. Each second wire groove has two ends each connected to a second through hole extending through to the first side. The first wires are located within the first wire grooves, with their two ends passing through the first through holes. The second wires are located within the second wire grooves, with their two ends passing through the second through holes. In some embodiments, the two ends of the first wires are flush with the second side. In some embodiments, the two ends of the second wires are flush with the first side.

In some embodiments, the adjacent first wires are not parallel or the adjacent first wire grooves are not parallel. For example, the adjacent first wires intersect in extension directions or the adjacent first wire grooves intersect in extension directions. In some embodiments, the adjacent second wires are not parallel or the adjacent second wire grooves are not parallel. For example, the adjacent second wires intersect in extension directions or the adjacent second wire grooves intersect in extension directions.

In some embodiments, the adjacent first wires and the adjacent third wires have opposite tilting directions or the first wire grooves and third wire grooves have opposite tilting directions. "Opposite tilting directions" used herein means that first wires or first wire grooves tilt in one direction (e.g., left) and third wires or third wire grooves tilt in an opposite direction (e.g., right).

In some embodiments, one side of the third printed circuit board includes multiple fourth wire grooves distributed circumferentially along the through hole. Each forth wire groove has two ends each connected to fourth through hole extending through to the other side of the third printed circuit board. The fourth wires are located within the fourth wire grooves, with their two ends extending through the fourth through holes and electrically connected to two ends of the second wires.

In some embodiments, the adjacent fourth wires are not parallel or the adjacent fourth wire grooves are not parallel. The adjacent fourth wires intersect in extension directions or the adjacent fourth wire grooves intersect in extension directions.

In some embodiments, the second wires and the fourth wires have opposite tilting directions or the second wire grooves and fourth wire grooves have opposite tilting directions. "Opposite tilting directions" used herein means that second wires or second wire grooves tilt in one direction (e.g., left) and fourth wires or fourth wire grooves tilt in an opposite direction (e.g., right).

Figure 12:
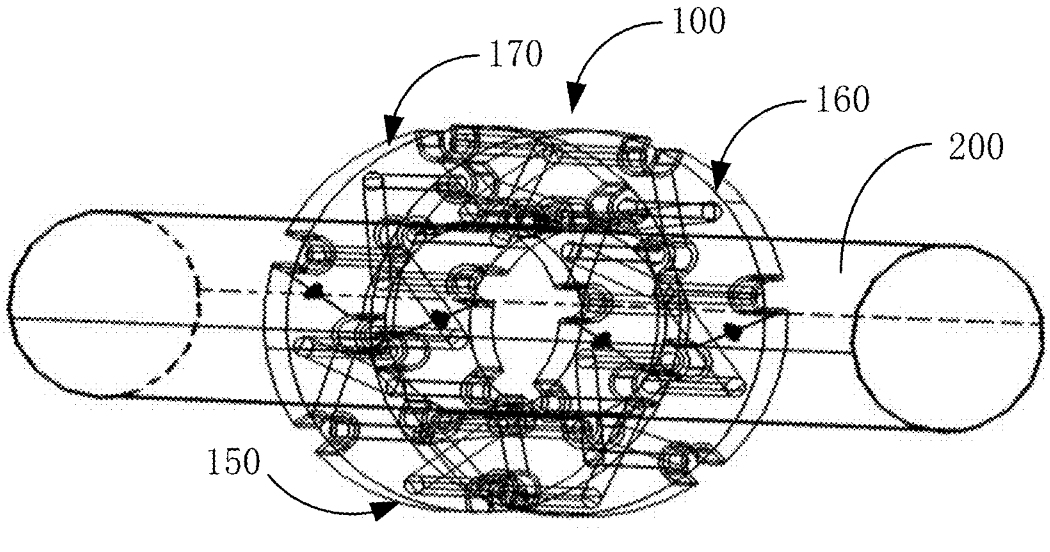
FIG. 12 is a schematic diagram showing a perspective view of a transmission cable assembly with a trap composed of a first printed circuit board (PCB), a second printed circuit board (PCB), and a third printed circuit board (PCB), and a transmission cable inserted therein, according to embodiments of the present disclosure.

FIG. 12 is a schematic diagram showing a perspective view of a transmission cable assembly with a trap 100 composed of a first printed circuit board (PCB) 150, a second printed circuit board (PCB) 160, and a third printed circuit board (PCB) 170, and a transmission cable 200 inserted therein, according to embodiments of the present disclosure. As shown in FIG. 12, first PCB 150, second PCB 160, and third PCB 170 are stacked to form trap 100, with first PCB positioned in the middle, second PCB 160 located on one side of first PCB 150, and third PCB 170 located on the other side of the first PCB 150. In some embodiments, first PCB 150, second PCB 160, and third PCB 170 may each be a ring-shaped disk with a through hole in the center so that transmission cable 20 can be inserted through the assembly. In some embodiments, first PCB 150, second PCB 160, and third PCB 170 may have same outer diameters (diameters of the disks) and inner diameters (diameters of the through holes).

In some embodiments, first PCB 150 may have multiple first conducting wires and second conducting wires arranged in different helical directions. Second PCB 160 may have multiple third conducting wires that are electrically connected end-to-end with the first conducting wires of first PCB 150 to form first coil 110. Third PCB 170 may have multiple fourth conducting wires that are electrically connected end-to-end with the second conducting wires of first PCB 150 to form second coil 120.

By arranging second PCB 160 and third PCB 170 on opposite sides of first PCB 150 and having conducting wires wound in opposite helical directions, the size and weight of trap 100 can be reduced. This arrangement also allows the formed first coil 110 and second coil 120 to be independent of each other, enhancing the performance of the trap in suppressing common-mode currents.

Figure 13:
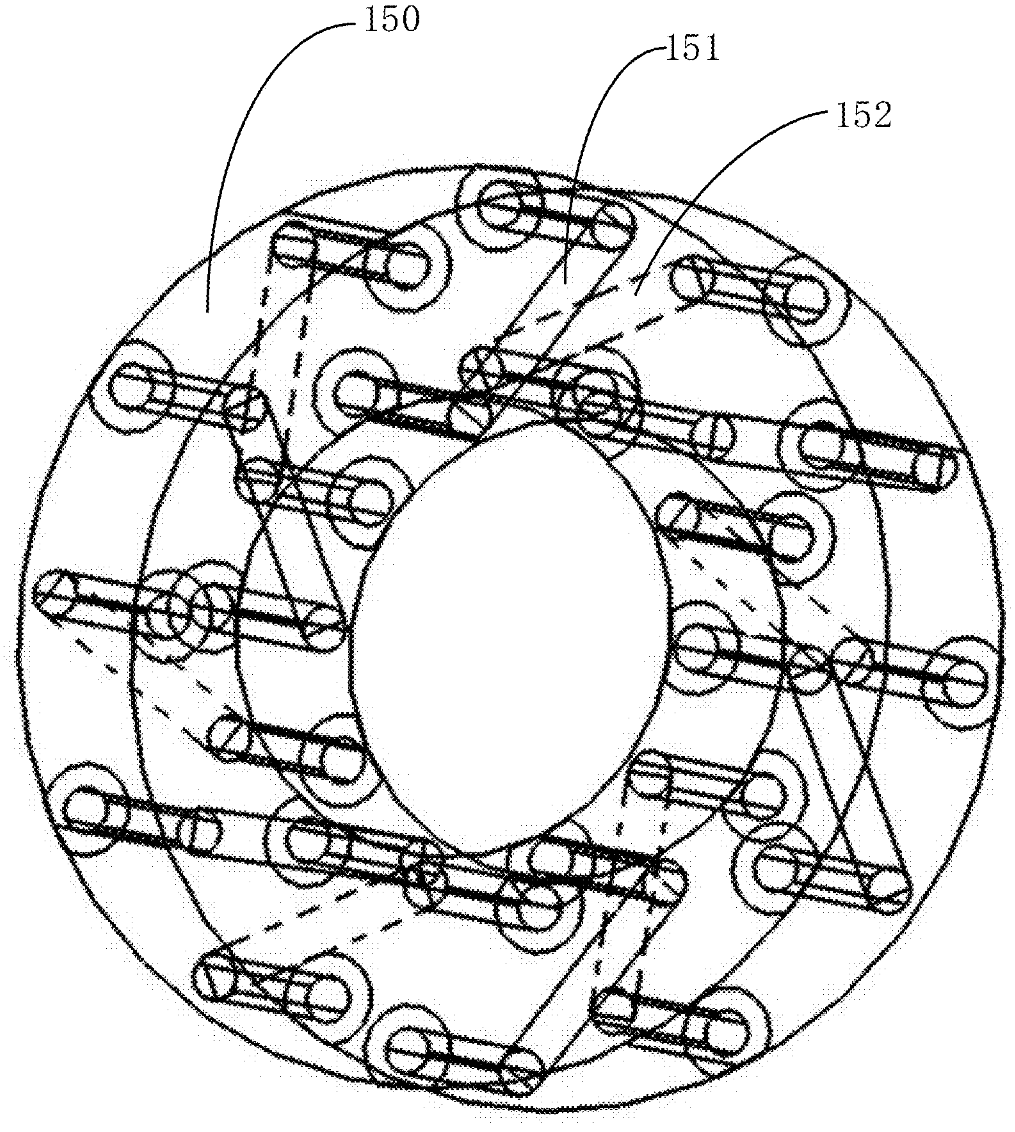
FIG. 13 is a schematic diagram showing a perspective view of a first printed circuit board (PCB) in a trap, according to embodiments of the present disclosure.
Figure 14:
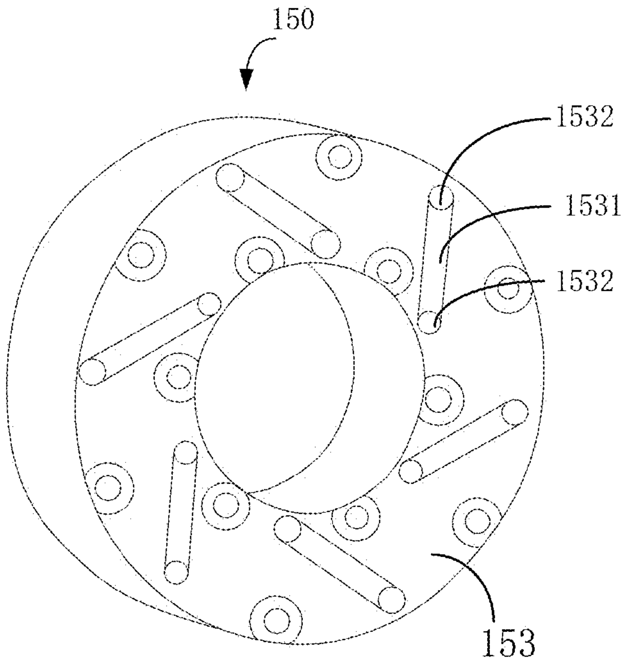
FIG. 14 is a schematic diagram showing a front surface of the first PCB of FIG. 13, according to embodiments of the present disclosure.
Figure 15:
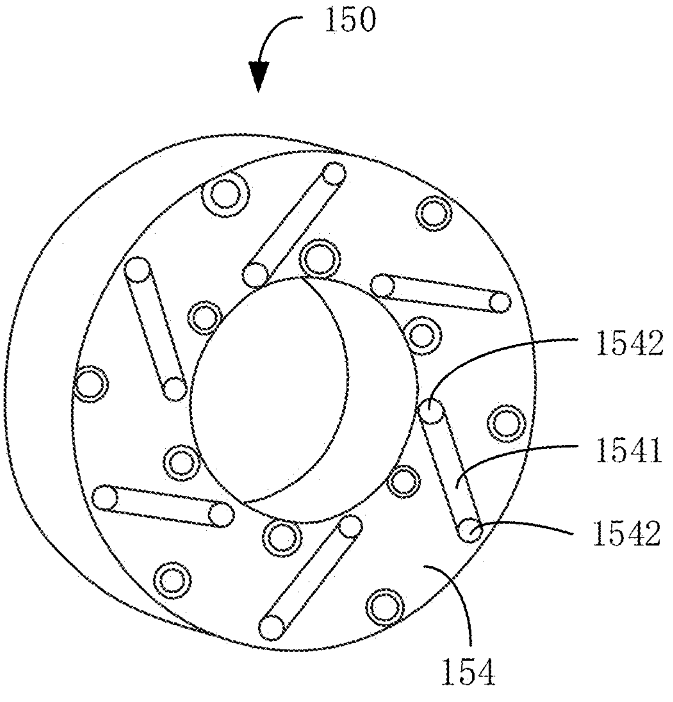
FIG. 15 is a schematic diagram showing a back surface of the first PCB of FIG. 13, according to embodiments of the present disclosure.

FIG. 13 is a schematic diagram showing a perspective view of a first printed circuit board (PCB) 150 in a trap, according to embodiments of the present disclosure. FIG. 14 is a schematic diagram showing a front surface of the first PCB of FIG. 13, according to embodiments of the present disclosure. FIG. 15 is a schematic diagram showing a back surface of the first PCB of FIG. 13, according to embodiments of the present disclosure. FIGS. 13-15 will be described together.

As shown in FIGS. 13-15, first PCB 150 may be a ring-shaped disk with a through hole in the center so that the transmission cable can be inserted through. In some embodiments, first PCB 150 may have multiple first conducting wires 151 and multiple second conducting wires 152. First printed circuit board 150 may include two opposing sides: a first side 153 (the side shown in FIG. 14) and a second side 154 (the side shown in FIG. 15). First conducting wires 151 may be arranged on first side 153 and second conducting wires 152 may be arranged on second side 154. In some embodiments, first conducting wires 151 and second conducting wires 152 may have opposite helical directions.

In some embodiments, as shown in FIGS. 14 and 15, there may be multiple first wire grooves 1531 provided on first side 153 and multiple second wire grooves 1541 provided on second side 154. These first wire grooves and second wire grooves may be spaced circumferentially along the through hole. It is contemplated that first PCB 150 may include more or fewer first wire grooves 1531 and second wire grooves 1541 as shown in FIGS. 13-15. Each first wire groove 1531 has two ends, each end configured with a first wiring through-hole 1532 extending to second side 154. Similarly, each second wire groove 1541 also has two ends, each end configured with a second wiring through-hole 1542 extending to first side 153. In some embodiments, the grooves can be square-shaped grooves or U-shaped grooves. It is contemplated that the shape and size of first wire grooves 1531 and second wire grooves 1541 are not limited to specific designs.

Consistent with some embodiments, each first conducting wire 151 may be placed inside a first wire groove 1531, and the two ends of first conducting wire 151 pass through first through-holes 1532. In some embodiments, the two ends of first conducting wires 151 are flush with second side 154. Similarly, each second conducting wire 152 may be placed inside a second wire groove 1541, and the two ends of second conducting wire 152 pass through second through-holes 1542. In some embodiments, the two ends of second conducting wires 152 are flush with first side 153. In some embodiments, directions of the adjacent first wire grooves 1531 are not parallel. For example, the adjacent first wire grooves 1531 are arranged to intersect in their extension directions. That is, the direction in which a first wire groove 1531 extends is not parallel with the direction in which its neighboring first wire groove 1531. Similarly, directions of the adjacent second wire grooves 1541 are not parallel. For example, the adjacent second wire grooves 1541 also intersect in their extension directions. In addition, as shown in FIGS. 14-15, first wire grooves 1531 and second wire grooves 1541 have opposite tilting directions.

By including multiple first wire grooves 1531 and second wire grooves 1541 on first side 153 and second side 154 of first PCB 150, it becomes easier to accommodate the first conducting wires 151 and second conducting wires 152. Furthermore, by providing first through-holes 1532 at the ends of the first wire grooves 1531 that extend through first PCB 150, it allows the two ends of first conducting wires 151 to pass through to second side 154, making it convenient to electrically connect the ends of first conducting wires 151 to two different conducting wires of the second PCB that will be described later. Similarly, by providing second through-holes 1542 at the ends of second wire grooves 1541 that extend through first PCB 150, it allows the two ends of the second conducting wires 152 to pass through to first side 153, making it convenient to electrically connect the ends of the second conducting wires 152 to two different conducting wires of the third PCB that will be described later.

The intersecting extension directions of adjacent first wire grooves 1531 allows first conducting wires 151 placed inside first wire grooves 1531 to form a shape of a wound coil after being electrically connected to the third conducting wires of second PCB 160. Similarly, intersecting extension directions of adjacent second wire grooves 1541 allows second conducting wires 152 placed inside second wire grooves 1532 to form a shape of a wound coil after being electrically connected to the fourth conducting wires of third PCB 170. In some embodiments, directions of first wire grooves 1531 and second wire grooves 1541 are non-limiting only if first coil 110 and second coil 120 are able to have opposite helical directions. In some embodiments, the first wire grooves 1531 and second wire grooves 1541 have opposite tilting directions.

In some embodiments, first PCB 150 is a ring-shaped disk, and first through-holes 1532 at the ends of first wire grooves 1531 and second through-holes 1542 at the ends of second wire grooves 1541 are positioned on the inner and outer walls of the first PCB 150 near first side 153 and second side 154, respectively. This allows the ends of first conducting wires 151 and second conducting wires 152 to be securely fixed to first PCB 150. In some embodiments, the depth of first wire grooves 1531 and second wire grooves 1541 is greater than the diameter of first conducting wires 151 and second conducting wires 152, ensuring that the ends of the first conducting wires 151 and second conducting wires 152 do not protrude from first wire grooves 1531 and second wire grooves 1541. This enables second PCB 160 and third PCB 170 to fit snugly against first side 153 and second side 154 of first PCB 150, resulting in a more compact structure and a smaller overall size for trap 100.

Figure 16:
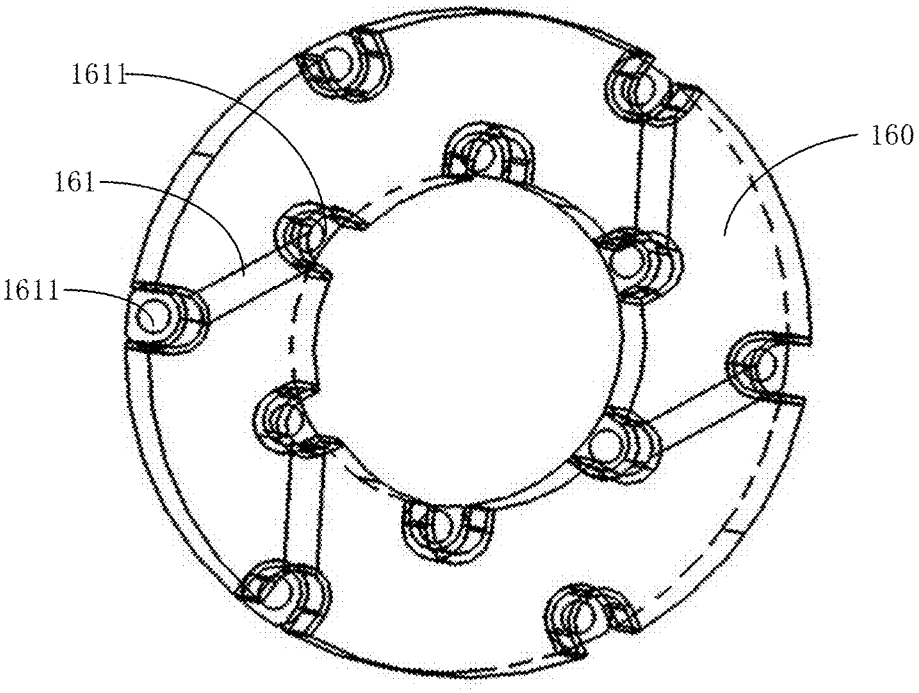
FIG. 16 is a schematic diagram showing a perspective view of a second printed circuit board (PCB) in a trap, according to embodiments of the present disclosure.

FIG. 16 is a schematic diagram showing a perspective view of a second printed circuit board (PCB) 160 in a trap, according to embodiments of the present disclosure. As shown in FIG. 16, like first PCB 150, second PCB 160 may also be a ring-shaped disk with a through hole in the center so that the transmission cable can be inserted through. In some embodiments, unlike first wire grooves 1531 and second wire grooves 1541 on the sides of first PCB 150, second PCB 160 has multiple circumferentially spaced third wire grooves 161 along the through-hole. In some embodiments, each third wire groove 161 has two ends, each end with a third through-hole 1611 that extends through to the side of second PCB 160 facing the first printed circuit board 150. In some embodiments, the extension directions of adjacent third wire grooves 161 intersect.

Third conducting wires may be placed inside third wire grooves 161. The two ends of the third conducting wires pass through the third through-holes 1611. In some embodiments, the two ends of the third conducting wires are flush with the other side of second PCB 160. The two ends of the third conducting wires are electrically connected to the ends of corresponding first conducting wires 151 located near the third conducting wires, forming first coil 110. In some embodiments, the tilting directions of first wire grooves 1531 and third wire grooves 161 are opposite. The opposite tilting directions of first wire grooves 1531 and third wire grooves 161 allow first conducting wires 151 of first PCB 150 and the third conducting wires of second PCB 160 to form a spiral coil after connection.

In some embodiments, the depth of third wire grooves 161 is greater than the diameter of the third conducting wires to ensure that the third conducting wires do not protrude from third wire grooves 161. In some embodiments, the two ends of first conducting wires 151 and the third conducting wires are connected by soldering. The positions of third through-holes 1611 located at both ends of third wire grooves 161 correspond to the positions of first through-holes 1532 adjacent to first wire grooves 1531 on first PCB 150. This alignment allows the ends of the third conducting wires within third through-holes 1611 to be properly connected with the ends of first conducting wires 151 inside the first through-holes, facilitating the soldering process. In some embodiments, third through-holes 1611 may be located between the inner and outer walls of second PCB 160. In some alternative embodiments, third through-holes 1611 can be notches that are recessed from the inner wall towards the outer wall of second PCB 160, or vice versa. This configuration allows the ends of the third conducting wires to protrude from second PCB 160, facilitating the soldering process.

Figure 17:
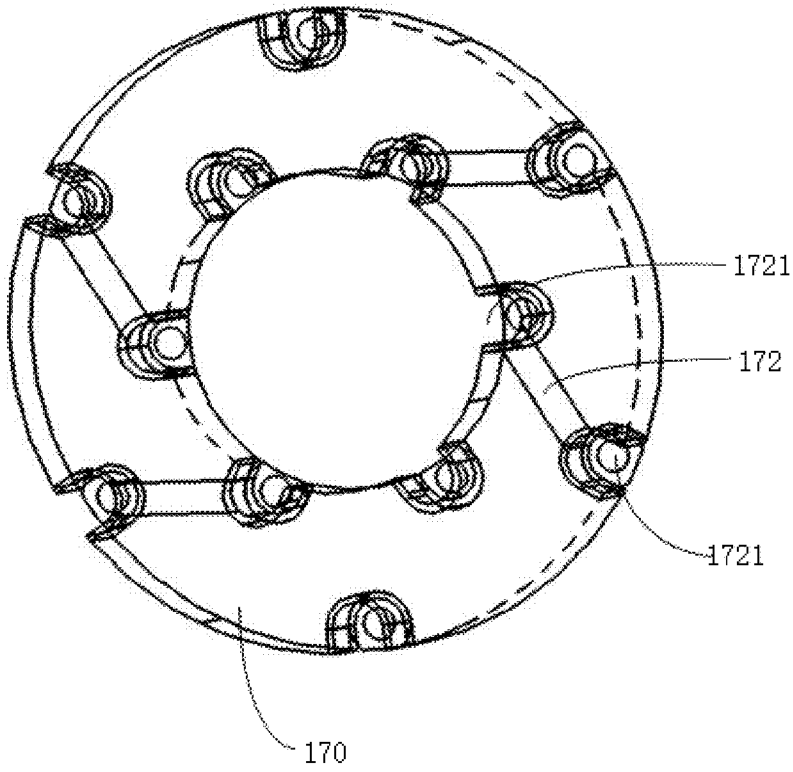
FIG. 17 is a schematic diagram showing a perspective view of a third printed circuit board (PCB) in a trap, according to embodiments of the present disclosure.

FIG. 17 is a schematic diagram showing a perspective view of a third printed circuit board (PCB) 170 in a trap, according to embodiments of the present disclosure. In some embodiments, third PCB 170 may be in a similar construction as second PCB 160, except it is stacked to first PCB 150 on the opposite side. As shown in FIG. 17, like second PCB 160, third PCB 160 may also be a ring-shaped disk with a through hole in the center so that the transmission cable can be inserted through. In some embodiments, like second PCB 160, third PCB 170 also has multiple circumferentially spaced fourth wire grooves 172 along the through-hole. In some embodiments, each fourth wire groove 172 has two ends, each end with a fourth through-hole 1721 that extends through to the side of third PCB 170 facing the first printed circuit board 150. In some embodiments, the extension directions of adjacent fourth wire grooves 172 intersect.

Fourth conducting wires may be placed inside fourth wire grooves 172. The two ends of the fourth conducting wires pass through the fourth through-holes 1721. In some embodiments, the two ends of the fourth conducting wires are flush with the other side of third PCB 170. The two ends of the fourth conducting wires are electrically connected to the ends of corresponding second conducting wires 161 located near the fourth conducting wires, forming second coil 120. In some embodiments, the tilting directions of second wire grooves 1541 and fourth wire grooves 172 are opposite. The opposite tilting directions of second wire grooves 1541 and fourth wire grooves 172 allow second conducting wires 161 of first PCB 150 and the fourth conducting wires of third PCB 170 to form a spiral coil after connection.

In some embodiments, the depth of fourth wire grooves 172 is greater than the diameter of the fourth conducting wires to ensure that the fourth conducting wires do not protrude from fourth wire grooves 172. In some embodiments, the two ends of second conducting wires 161 and the fourth conducting wires are connected by soldering. The positions of fourth through-holes 1721 located at both ends of fourth wire grooves 172 correspond to the positions of second through-holes 1542 adjacent to second wire grooves 1541 on second PCB 160. This alignment allows the ends of the fourth conducting wires within fourth through-holes 1721 to be properly connected with the ends of second conducting wires 161 inside the second through-holes, facilitating the soldering process. In some embodiments, fourth through-holes 1721 may be located between the inner and outer walls of third PCB 170. In some alternative embodiments, fourth through-holes 1721 can be notches that are recessed from the inner wall towards the outer wall of third PCB 170, or vice versa. This configuration allows the ends of the fourth conducting wires to protrude from third PCB 170, facilitating the soldering process.

It should be noted that, the above descriptions of FIGS. 12-17 are for illustration purposes and non-limiting. In some embodiments, wires grooves are unnecessary, and first wire grooves 1531 in FIG. 14 can be denoted as the first wires, second wire grooves 1541 in FIG. 15 can be denoted as the second wires, third wire grooves 161 in FIG. 16 can be denoted as the third wires, and fourth wire grooves 172 in FIG. 17 can be denoted as the fourth wires.

In some embodiments, the transmission cable assembly may include multiple traps fitted to transmission cable. An insulating component may be placed between every two adjacent traps. FIGS. 18-22 show various embodiments with such a transmission cable assembly. As shown in FIGS. 18-22, multiple traps 100 may fit on transmission cable 200 and serially connected along the axis (the longitudinal direction) of transmission cable 200. Between every two adjacent traps 100, there is an insulating component 300.

In some embodiments, each insulating component 300 has one or more mounting holes to mount traps 100. There is one insulating component 300 on each side of a trap 100. Multiple traps 100 are spaced apart along the longitudinal axis of transmission cable 200. Insulating components 300 isolate the adjacent traps 100 between which they are placed, preventing short circuits between the traps. Each trap 100 is fitted around the outer circumference of transmission cable 200.

Figure 18:
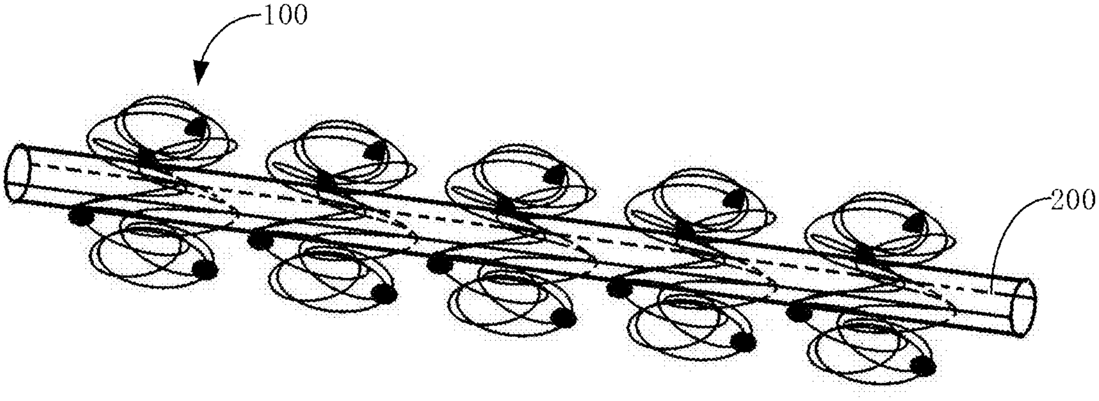
FIG. 18 is a schematic diagram showing a transmission cable assembly with multiple closed-loop spiral coil traps fitted on a transmission cable, according to embodiments of the present disclosure.
Figure 19:
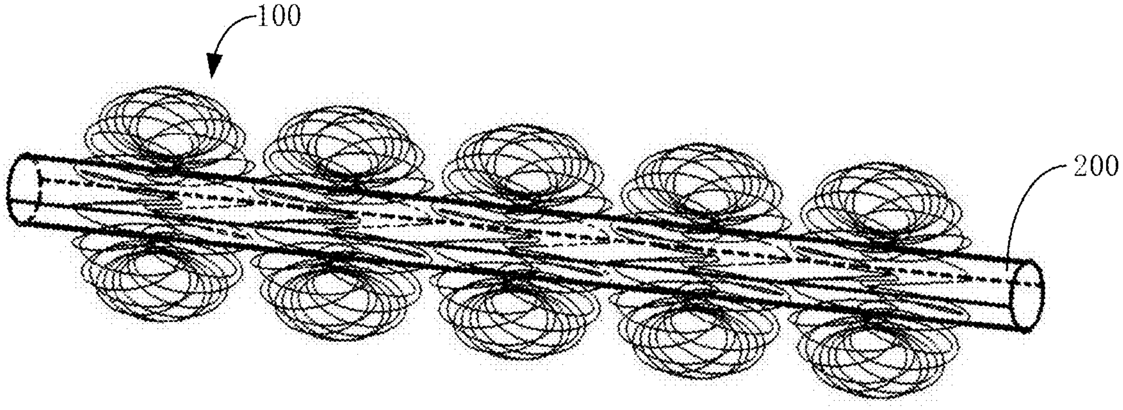
FIG. 19 is a schematic diagram showing a transmission cable assembly with multiple open-loop spiral coil traps fitted on a transmission cable, according to embodiments of the present disclosure.
Figure 20:
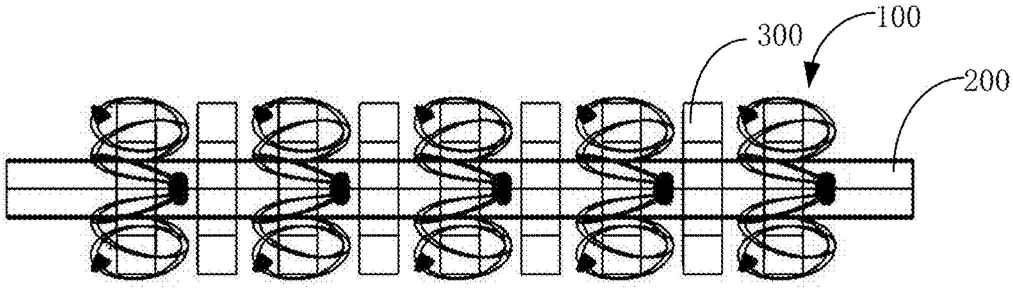
FIG. 20 is a schematic diagram showing a transmission cable assembly with multiple closed-loop spiral coil traps wound around respective brackets fitted on a transmission cable, according to embodiments of the present disclosure.
Figure 21:
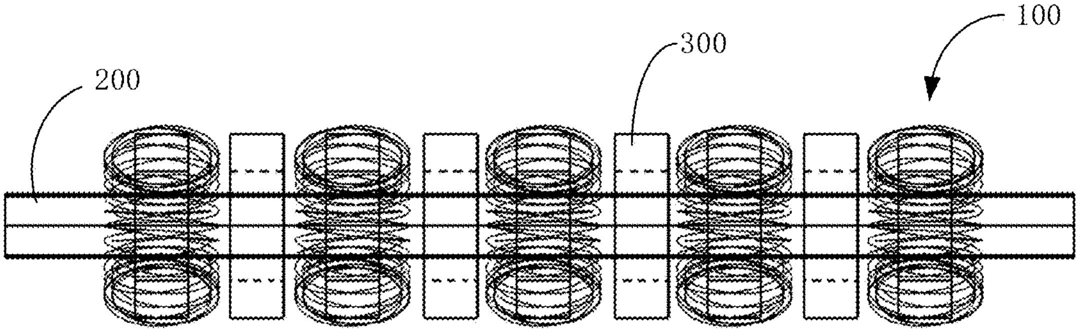
FIG. 21 is a schematic diagram showing a transmission cable assembly with multiple open-loop spiral coil traps wound around respective brackets fitted on a transmission cable, according to embodiments of the present disclosure.
Figure 22:
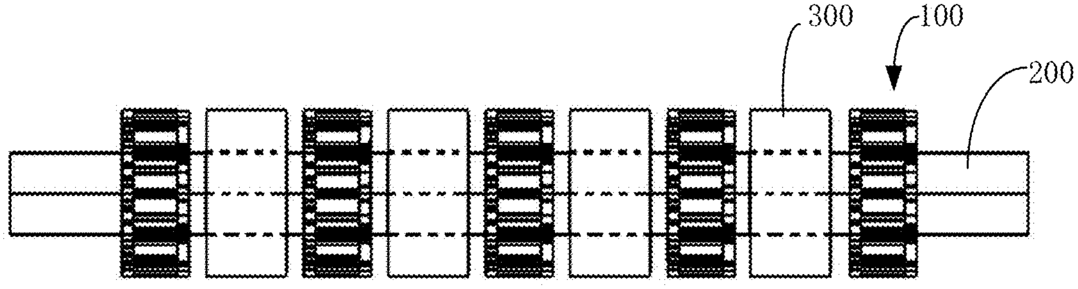
FIG. 22 is a schematic diagram showing a transmission cable assembly with multiple PCB traps fitted on a transmission cable, according to embodiments of the present disclosure.

It is contemplated that any type of trap, including at least those embodiments described above, can be serially connected to form this trap assembly. For example, FIG. 18 is a schematic diagram showing a transmission cable assembly with multiple closed-loop spiral coil traps fitted on a transmission cable, according to embodiments of the present disclosure. FIG. 19 is a schematic diagram showing a transmission cable assembly with multiple open-loop spiral coil traps fitted on a transmission cable, according to embodiments of the present disclosure. FIG. 20 is a schematic diagram showing a transmission cable assembly with multiple closed-loop spiral coil traps wound around respective brackets fitted on a transmission cable, according to embodiments of the present disclosure. FIG. 21 is a schematic diagram showing a transmission cable assembly with multiple open-loop spiral coil traps wound around respective brackets fitted on a transmission cable, according to embodiments of the present disclosure. FIG. 22 is a schematic diagram showing a transmission cable assembly with multiple PCB traps fitted on a transmission cable, according to embodiments of the present disclosure.

The serial arrangement provides the transmission cable assembly with enhanced common-mode current suppression capabilities and results in low heat generation, and thus are suitable for different types of transmission cables. The serial trap assembly can be easily installed on and completely detached any transmission cable without affecting any coil parameters, making it convenient for manufacturing and debugging. This also disperses the energy across multiple traps 100, reducing the heat generated by individual traps 100. Even if a specific trap is damaged, it will not affect the overall effectiveness of common-mode current suppression.

Figure 23:
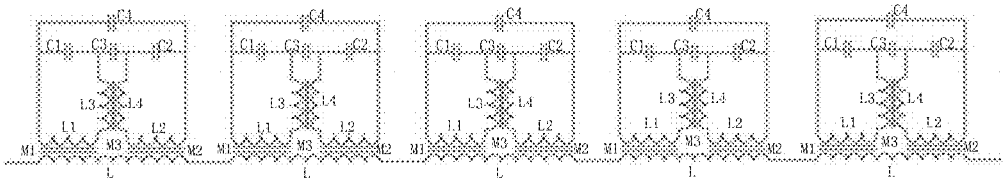
FIG. 23 shows an equivalent circuit diagram of an exemplary transmission cable assembly having multiple closed-loop traps, according to embodiments of the present disclosure.
Figure 24:
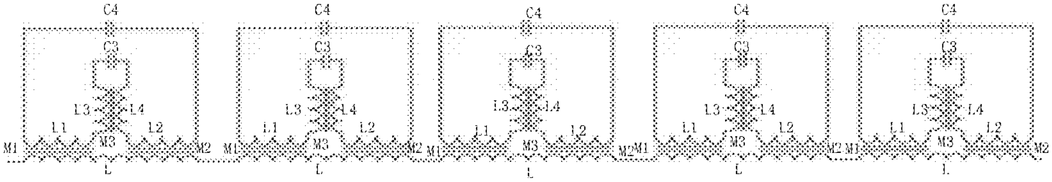
FIG. 24 shows an equivalent circuit diagram of another exemplary trap assembly having multiple open-loop traps, according to embodiments of the present disclosure.

When multiple traps 100 are serially connected along the longitude axis of transmission cable 200, the traps are connected electrically in series. For example, FIG. 23 shows an equivalent circuit diagram of an exemplary transmission cable assembly having multiple closed-loop traps and FIG. 24 shows an equivalent circuit diagram of another exemplary trap assembly having multiple open-loop traps, according to embodiments of the present disclosure.

Some embodiments of the present disclosure may provide at least one trap used to suppress interference signals on a transmission cable. The at least one trap may be fitted on (e.g., detachably fitted on) the transmission cable. Each of the at least one trap may include a first coil and a second coil in the same winding direction, e.g., the clockwise direction, the anticlockwise direction. In some embodiments, the first coil and the second coil may circumferentially surround at least a portion of the transmission cable. In some embodiments, the transmission cable includes multiple portions along the longitude direction of the transmission cable. For example, the at least a portion of the transmission cable may include one portion of the multiple portions of the transmission cable. In some embodiments, there are multiple traps, and one trap is fitted onto each of at least one portion of the multiple portions of the transmission cable.

The first coil and the second coil may be open-loop coils or closed-loop coils. In some embodiments, when the first coil and the second coil are closed-loop coils, an end of the transmission cable may be inserted into a center through hole of the at least one trap, such that the at least one trap wraps around the transmission cable. When the first coil and the second coil are open-loop coils, the transmission cable may pass through gaps of the first coil and the second coil, such that the at least one trap wraps around the transmission cable.

In some embodiments, the first coil and the second coil may be spaced apart from each other or interleaved. The resonance may be formed by utilizing the distributed capacitances and inductances between the two coils. The values of the distributed capacitances and/or inductances may be adjusted by adjusting the spacing between the first coil and the second coil. When the common-mode current appears on the transmission cable, the energy enters the coils through coupling, and the current opposite to the direction of the common mode current is formed in the center of the coils, thereby suppressing the common-mode current. Because the at least one trap of the present disclosure is wrapped around the transmission cable, the at least one trap can be easily installed on and completely detached any transmission cable without affecting parameters of the transmission cable itself, therefore, the loss of the transmission cable (e.g., RF transmission cable) may not be additionally increased.

Besides, fitting the disclosed trap to the transmission cable without direct electrical connections improves maintainability. The disclosed trap skips the need to wind the transmission cable itself. Accordingly, the volume of the trap is no longer limited by the thickness of the transmission cable, allowing them to be smaller and lighter. The design can reduce the size and weight of the trap, while achieving the desired common-current reduction effects.

Figure 25:
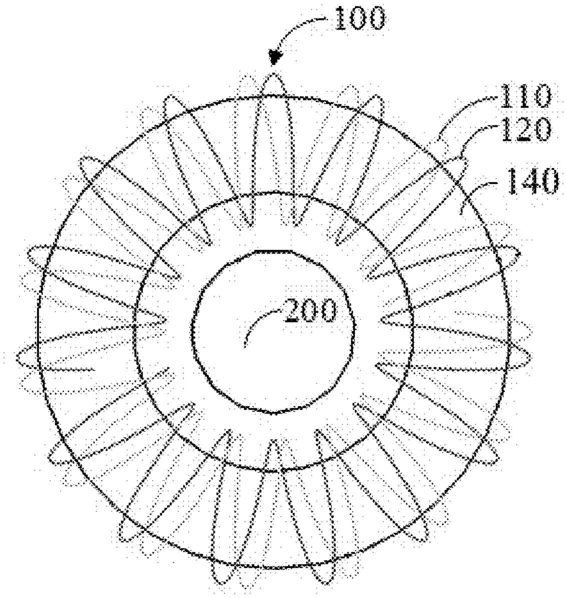
FIG. 25 is a schematic diagram of a trap fitted on a transmission cable according to embodiments of the present disclosure.
Figure 26:
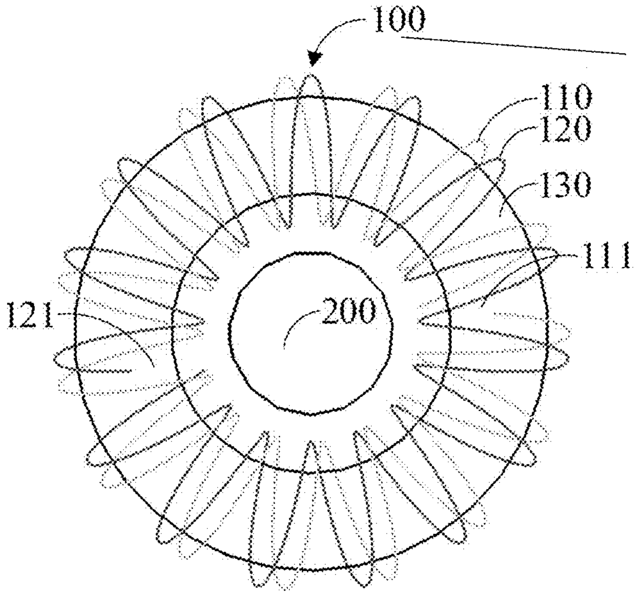
FIG. 26 is a perspective diagram of a trap fitted on a transmission cable according to embodiments of the present disclosure.

FIG. 25 is a schematic diagram of a trap fitted on a transmission cable according to embodiments of the present disclosure. FIG. 26 is a perspective diagram of a trap fitted on a transmission cable according to embodiments of the present disclosure. The transmission cable assemblies in FIGS. 25 and 26 include a single trap and will be described together.

Trap 100 may be (detachably) fitted to transmission cable 200. Trap 100 wrap around transmission cable 200 in use. Trap 100 includes a first coil 110 and a second coil 120 made of conductive materials (e.g., metallic material). Trap 100 is prepared by: winding first coil 110 (or second coil 120) into an annulus and spiral coil. In some embodiments, the shape and/or size of first coil 110 and second coil 120 may be the same.

First coil 110 is an open-loop coil, that is, two ends of first coil 110 are separated by at least one first gap. Second coil 110 is an open-loop coil, that is, two ends of second coil 120 are separated by at least one second gap. The gaps of first coil 110 and second coil 120 are symmetrically arranged as shown in FIG. 26. In some other embodiments, the gaps of first coil 110 and second coil 120 may be set close to each other (e.g., as shown in FIG. 25). The tuning can be changed by adjusting the relative position of the gaps and/or the count of the gaps.

Figure 27:
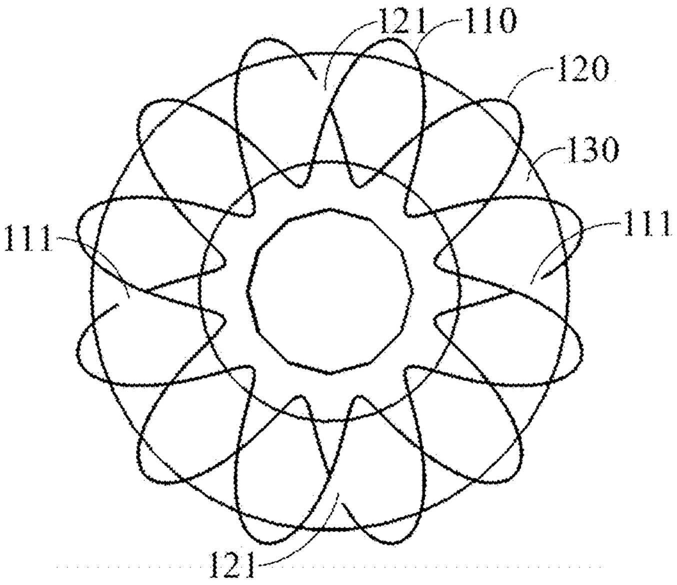
FIG. 27 shows a trap with multiple gaps according to embodiments of the present disclosure.

As shown in FIG. 26, first coil 110 includes a first gap 111, and second coil 120 includes a second gap 121. A count of the at least one first gap and/or a count of the at least one second gap may be non-limiting. In some embodiments, first coil 110 may have multiple first gaps, and/or second coil 120 may have multiple second gaps. The multiple first gaps (or the multiple second gaps) are alternately arranged on the first coil (or the second coil). FIG. 27 shows a trap with multiple gaps according to embodiments of the present disclosure. As shown in FIG. 27, two first gaps 111 are alternately arranged on first coil 110, and two second gaps 121 are alternately arranged on second coil 120. By arranging multiple gaps on first coil 110 and second coil 120 respectively, the tuning can be carried out by adjusting the count of gaps and/or the position of the gaps, so that the trap 100 is convenient for debugging.

In some embodiments, at least one first tuning capacitor (e.g., a lumped capacitor) may be set on first coil 110, and/or at least one second tuning capacitor (e.g., a lumped capacitor) may be set on second coil 120. In some embodiments, the at least one first tuning capacitor (or the at least one second tuning capacitor) may be located at least one gap of first coil 110 (or second coil 120). In some embodiments, when first coil 110 includes multiple first gaps, a tuning capacitor may be arranged at each individual first gap. When second coil 120 includes multiple second gaps, a tuning capacitor may be arranged at each individual second gap.

Figure 28:
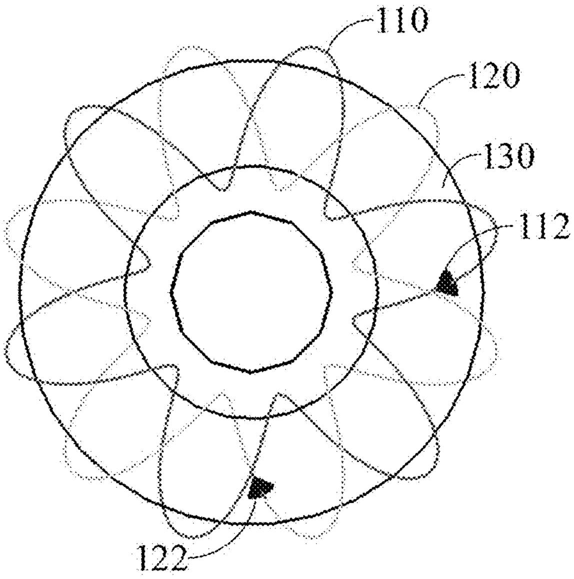
FIG. 28 shows a trap with tuning capacitors disposed on gaps according to embodiments of the present disclosure.

FIG. 28 shows a trap with tuning capacitors disposed on gaps according to embodiments of the present disclosure. As shown in FIG. 28, trap 100 includes a first lumped capacitor 112 and a second lumped capacitor 122. First lumped capacitor 112 may be connected to a first gap 111 of first coil 110, and second lumped capacitor 122 may be connected to a second gap 121 of second coil 120. In some embodiments, lumped capacitor 112 or 122 may be composed of one or more capacitors. By arranging first lumped capacitor 112 on first coil 110 and second lumped capacitor 122 on second coil 120, the capacitance values of the lumped capacitors can be changed for tuning, so as to facilitate the debugging of trap 100.

Figure 29:
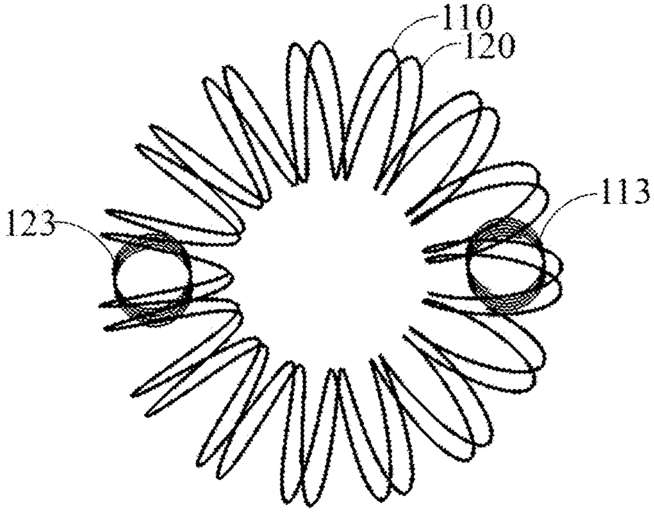
FIG. 29 is a schematic diagram showing a trap with twisted pair structure, according to embodiments of the present disclosure.

In some embodiments, first coil 110 may include at least one first twisted pair structure and/or second coil 120 may include at least one second twisted pair structure. One of the at least one first twisted pair structure and/or the at least one second twisted pair structure may extend along a longitudinal axis of the direction. FIG. 29 is a schematic diagram showing a trap with twisted pair structure, according to embodiments of the present disclosure. As shown in FIG. 29, first coil 110 may include a first twisted pair structure 113, and second coil 120 may include a second twisted pair structure 123. First coil 110 can extend from the end of its gap to form first twisted pair structure 113 that is intertwined with each other. Second coil 120 can extend from the end of its gap to form second twisted pair structure 123 that is intertwined with each other. The extension direction of first twisted pair structure 113 and second twisted pair structure 123 in FIG. 29 are parallel to the longitudinal axis of transmission cable 200. By adjusting the length, position, or direction of first twisted pair structure 113 and/or second twisted pair structure 123, the value of the distributed capacitance of trap 100 can be adjusted, facilitating the tuning of the trap 100.

It should be noted that when first coil 110 (or second coil 120) includes multiple gaps, a twisted pair structure may be disposed in each individual gap of the multiple gaps.

In some embodiments, at least one bracket may be used as a support frame to support trap 100. For example, trap 100 may be fixedly arranged on the at least one bracket. In some embodiments, the at least one bracket may be wrapped around the transmission cable. For example, the at least one bracket may be configured to allow the transmission cable to pass through the trap. In some embodiments, the at least one bracket may be made of insulating material. As shown in FIG. 25, bracket 140 is configured to support (e.g., fix) first coil 110 and second coil 120. Bracket 140 includes a through hole 141 in the center to allow transmission cable 200 to be inserted and pass through. First coil 110 and second coil 120 are wound around bracket 140, ensuring their stability on transmission cable 200. In order to protect first coil 110 and second coil 120, the gap between first coil 110 (or second coil 120) and bracket 140 may be filled with insulating material, or the parts where first coil 110 (or second coil 120) are in contact with transmission cable 200 may be filled with insulating material. In some other embodiments, a notch may also be arranged on bracket 140 for wrapping and/or fixing first coil 110 and second coil 120. In some other embodiments, first coil 110 and second coil 120 may be directly fixed on transmission cable 200 using curable insulating materials without arranging bracket 140.

In some embodiments, two first ends of first coil 110 may be fixed on bracket 140 by a gluing manner (e.g., a dispensing fixation manner), and two second ends of second coil 120 may be fixed on bracket 140 by a gluing manner (e.g., a dispensing fixation manner). For example, first coil 110 and second coil 120 are each provided with only one gap, and when first coil 110 (or second coil 120) is fixed to bracket 140, first coil 110 (or second coil 120) is first threaded on the bracket 140, and then the ends of the gap are respectively fixed with the bracket 140 using the gluing manner. When a plurality of gaps are arranged on first coil 110 (or second coil 120), the ends of each gap can be fixed with bracket 140 by the gluing manner. In some embodiments, a fixing hole may also be arranged on bracket 140, and first coil 110 and second coil 120 can be fixed in the fixing hole by fixing the ends of first coil 110 (or second coil 120).

Figure 30:
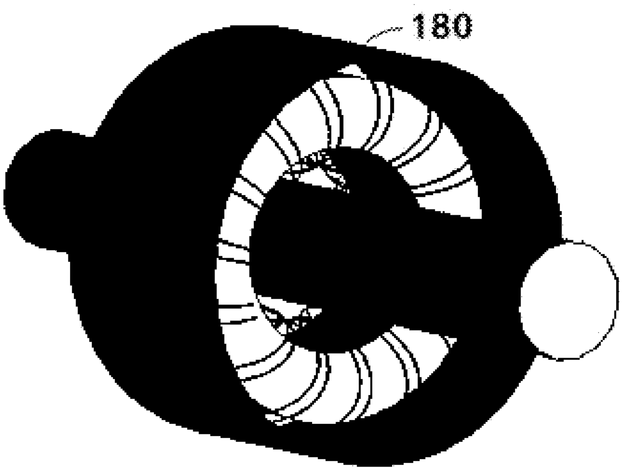
FIG. 30 is a schematic diagram showing a trap with a shielding enclosure according to embodiments of the present disclosure.

In some embodiments, at least one shielding enclosure may be arranged to cover the trap, thereby reducing the influence of the magnetic field leaking from the trap on the radio frequency field. The at least one shielding enclosure may have an annular shape. An insulating material can be filled between the shielding enclosure and trap 100 for insulation and fixation. FIG. 30 is a schematic diagram showing a trap with a shielding enclosure according to embodiments of the present disclosure. As shown in FIG. 30, a shielding enclosure 180 covers trap 100.

Figure 32:
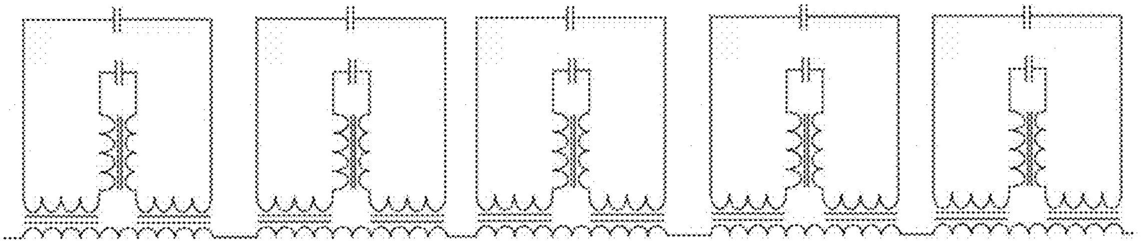
FIG. 32 shows an equivalent circuit diagram of the multiple traps in FIG. 31 according to embodiments of the present disclosure.

In some embodiments, multiple traps may be detachably fitted onto the transmission cable. All of the multiple traps may be in series connection. Two adjacent traps may be isolated by an insulating medium, e.g., air, plastic, rubber, glass, ceramics, epoxy resin, etc. FIG. 31 is a schematic diagram showing a transmission cable assembly with multiple open-loop spiral coil traps wound around respective brackets fitted on a transmission cable, according to embodiments of the present disclosure. FIG. 32 shows an equivalent circuit diagram of the multiple traps in FIG. 31 according to embodiments of the present disclosure. As shown in FIG. 31 and FIG. 32, five traps 100 are detachably fitted onto transmission cable 200.

The serial arrangement provides enhanced common-mode current suppression capabilities and results in low heat generation, and thus are suitable for different types of transmission cables. The serial traps can be easily installed on and completely detached any transmission cable without affecting any coil parameters, making it convenient for manufacturing and debugging. This also disperses the energy (e.g., the common-trend current) across multiple traps, reducing the heat generated by an individual trap. Even if a specific trap is damaged, it will not affect the overall effectiveness of common-mode current suppression.

In some embodiments, similar to the trap (trap 1) including coils wound in opposite directions, the trap (trap 2) including coils wound in the same direction can also be fabricated using PCBs. The design principle of the PCBs for trap 2 may be analogous to the design principle of the PCBs for trap 1, with the distinction that the coils are wound in the same direction.

According to some embodiments of the present disclosure, a RF coil assembly system may be provided. The RF coil assembly may be used in a MRI system. The RF coil assembly may have an RF coil, a transmission cable and at least one trap. The transmission cable may be coupled to the RF coil. The at least one trap may be (detachably) fitted onto the transmission cable in order to form a resonant circuit. Each of the at least one trap may be the same as or similar to the trap described above.

According to some embodiments of the present disclosure, an MRI system may be provided. The MRI system may include at least one trap. Each of the at least one trap may be the same as or similar to the trap described above.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. A transmission cable assembly, comprising:

a transmission cable; and at least one trap detachably fitted onto the transmission cable, wherein one of the at least one trap comprises a first coil and a second coil in opposite helical directions and assembled to allow the transmission cable to insert through, wherein each of the first coil and the second coil comprises a plurality of turns distributed along a circumferential direction of at least a portion of the transmission cable, the first coil and the second coil form a resonant circuit.

2. The transmission cable assembly according to claim 1, wherein the first coil and the second coil are each connected to at least one tuning capacitor or the ends of the first coil and the second coil are disconnected.

3. The transmission cable assembly according to claim 1, wherein the first coil and the second coil each form a spiral coil loop comprising the plurality of turns, wherein the plurality of turns of the first coil and the plurality of turns of the second coil wound in opposite helical directions, wherein the turns of the first coil interleave with the turns of the second coil when the first coil and the second coil are assembled.

4. The transmission cable assembly according to claim 1, wherein each turn of the first coil and each turn of the second coil are wound in the opposite helical directions.

5. The transmission cable assembly according to claim 1, wherein the first coil is wound in a clockwise direction and the second coil is wound in an anticlockwise direction; or the first coil is wound in the anticlockwise direction and the second coil is wound in the clockwise direction.

6. The transmission cable assembly according to claim 1, wherein the trap further comprises a bracket with a through hole, wherein the transmission cable is inserted into the through hole, wherein the first coil and the second coil are wound around the outer surface of the bracket and extend along the circumferential axis of the bracket.

7. The transmission cable assembly according to claim 6, wherein the outer surface of the bracket comprises a first limiting groove and a second limiting groove, and the first limiting groove and the second limiting groove have opposite helical directions, wherein the first coil is positioned inside the first limiting groove and the second coil is inside the second limiting groove.

8. The transmission cable assembly according to claim 1, wherein:

the first coil is formed by a first printed circuit board and a second printed circuit board located on one side of the first printed circuit board;

the second coil is formed by the first printed circuit board and a third printed circuit board located on the other side of the first printed circuit board; and wherein the first printed circuit board, the second printed circuit board, and the third printed circuit board each have a through hole to allow the transmission cable to insert through.

9. The transmission cable assembly according to claim 8, wherein:

the first printed circuit board comprises multiple first wires and multiple second wires;

the second printed circuit board comprises multiple third wires, each of which is electrically connected end-to-end with one of the first wires to form the first coil; and the third printed circuit board comprises multiple fourth wires, each of which is electrically connected end-to-end with one of the second wires to form the second coil, wherein at least one of the first wires, the second wires, the third wires, or the fourth wires is printed on surfaces of the first printed circuit board, the second printed circuit board, or the third printed circuit board, respectively; or at least one of the first wires, the second wires, the third wires, or the fourth wires is disposed inside wire grooves of the first printed circuit board, the second printed circuit board, or the third printed circuit board, respectively.

10. The transmission cable assembly according to claim 9, wherein:

the first printed circuit board comprises a first side and a second side;

the first side has multiple first wire grooves and the second side has multiple second wire grooves, the first wire grooves and the second wire grooves being distributed circumferentially along the through hole;

each first wire groove has two ends each connected to a first through hole extending through to the second side, and each second wire groove has two ends each connected to a second through hole extending through to the first side;

the first wires are located within the first wire grooves, with their two ends passing through the first through holes; and the second wires are located within the second wire grooves, with their two ends passing through the second through holes.

11. The transmission cable assembly according to claim 10, wherein:

the adjacent first wires intersect in extension directions or the adjacent first wire grooves intersect in extension directions; and the adjacent second wires intersect in extension directions or the adjacent second wire grooves intersect in extension directions.

12. The transmission cable assembly according to claim 9, wherein:

one side of the second printed circuit board comprises multiple third wire grooves distributed circumferentially along the through hole;

each third wire groove has two ends each connected to third through hole extending through to the other side of the second printed circuit board; and the third wires are located within the third wire grooves, with their two ends extending through the third through holes and electrically connected to two ends of the first wires.

13. The transmission cable assembly according to claim 12, wherein:

the adjacent third wires intersect in extension direction or the adjacent third wire grooves intersect in extension directions; and the adjacent first wires and the adjacent third wires have opposite tilting directions or the first wire grooves and third wire grooves have opposite tilting directions.

14. The transmission cable assembly according to claim 9, wherein:

one side of the third printed circuit board comprises multiple fourth wire grooves distributed circumferentially along the through hole;

each forth wire groove has two ends each connected to fourth through hole extending through to the other side of the third printed circuit board; and the fourth wires are located within the fourth wire grooves, with their two ends extending through the fourth through holes and electrically connected to two ends of the second wires.

15. The transmission cable assembly according to claim 14, wherein:

the adjacent fourth wires intersect in extension directions or the adjacent fourth wire grooves intersect in extension directions; and the second wires and the fourth wires have opposite tilting directions or the second wire grooves and fourth wire grooves have opposite tilting directions.

16. A transmission cable assembly, comprising:

a transmission cable;

a plurality of traps detachably fitted onto the transmission cable and spaced apart along a longitudinal axis of the transmission cable, wherein each trap comprises a first coil and a second coil in opposite helical directions and assembled to allow the transmission cable to insert through, and each of the first coil and the second coil comprises a plurality of turns distributed along a circumferential direction of at least a portion of the transmission cable; and an insulating component placed between every two adjacent traps.

17. The transmission cable assembly according to claim 16, wherein the first and the second coils of the plurality of traps form a plurality of resonant circuits connected in series.

18. The transmission cable assembly according to claim 16, wherein the first coil and the second coil are each connected to at least one tuning capacitor or the ends of the first coil and the second coil are disconnected.

19. The transmission cable assembly according to claim 16, wherein the first coil and the second coil each form a spiral coil loop comprising the plurality of turns, wherein the plurality of turns of the first coil and the plurality of turns of the second coil wound in opposite helical directions, wherein the turns of the first coil interleave with the turns of the second coil when the first coil and the second coil are assembled.

20. A radio frequency (RF) coil assembly for a magnetic resonance imaging (MRI) system, comprising:

an RF coil;

a transmission cable coupled to the RF coil; and at least one trap detachably fitted onto the transmission cable, wherein one of the at least one trap comprises:

two parallel wires wound in a spiral and circumferentially wrap around at least a portion of the transmission cable, wherein each of the two parallel wires comprises a plurality of turns distributed along a circumferential direction of the at least a portion of the transmission cable; or two counter-wound wires wound in a spiral and circumferentially wrap around at least a portion of the transmission cable, wherein each of the two counter-wound wires comprises a plurality of turns distributed along a circumferential direction of the at least a portion of the transmission cable, wherein the two parallel wires or the two counter-wound wires form a resonant circuit.

* * * * *